(12) United States Patent
Shindome et al.

(10) Patent No.: US 10,896,975 B2
(45) Date of Patent: Jan. 19, 2021

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Aya Shindome, Yokohama (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/565,715

(22) Filed: Sep. 10, 2019

(65) Prior Publication Data
US 2020/0220002 A1 Jul. 9, 2020

(30) Foreign Application Priority Data
Jan. 4, 2019 (JP) .................................. 2019-000127

(51) Int. Cl.
*H01L 29/00* (2006.01)
*H01L 29/778* (2006.01)
(Continued)

(52) U.S. Cl.
CPC ...... *H01L 29/7786* (2013.01); *H01L 29/0657* (2013.01); *H01L 29/2003* (2013.01)

(58) Field of Classification Search
CPC ............ H01L 29/2003; H01L 29/7786; H01L 29/0657
See application file for complete search history.

(56) References Cited

U.S. PATENT DOCUMENTS 9,419,119 B2 * 8/2016 Takada .............. H01L 21/28008
9,741,838 B2 * 8/2017 Nishikawa .......... H01L 29/0696
(Continued)

FOREIGN PATENT DOCUMENTS

JP 11-307547 A 11/1999
JP 2007-59595 A 3/2007
(Continued)

OTHER PUBLICATIONS

Herbecq, N, et al. "GaN-on-silicon high electron mobility transistors with blocking voltage of 3 kV", Electronics Letters, Sep. 17, 2015, vol. 51, No. 19, 2 pages.

*Primary Examiner* — Nicholas J Tobergte
(74) *Attorney, Agent, or Firm* — Oblon, McClelland, Maier & Neustadt, L.L.P.

(57) ABSTRACT

According to one embodiment, a semiconductor device includes a first electrode extending along a first direction, a second electrode including a portion extending along the first direction, a third electrode extending along the first direction, a first member, first and second semiconductor regions, and a conductive portion. A position of the second electrode in a second direction is between the third electrode and the first electrode in the second direction crossing the first direction. A distance along the second direction between the third and second electrodes is shorter than a distance along the second direction between the second and first electrodes. The first member includes first and second regions. A conductivity of the second region is lower than a conductivity of the first region. The first semiconductor region includes $Al_{x1}Ga_{1-x1}N$. The second semiconductor region includes $Al_{x2}Ga_{1-x2}N$. A conductive portion is electrically connected to the first electrode.

20 Claims, 33 Drawing Sheets

(51) Int. Cl.
*H01L 29/06* (2006.01)
*H01L 29/20* (2006.01)

(56) References Cited

U.S. PATENT DOCUMENTS

| | | | |
|---|---|---|---|
| 9,837,488 B2* | 12/2017 | Saito | H01L 29/0847 |
| 10,236,341 B2* | 3/2019 | Ohashi | H01L 29/063 |
| 10,573,735 B2* | 2/2020 | Koyama | H01L 29/7783 |
| 10,651,161 B2* | 5/2020 | Koyama | H01L 25/16 |
| 2007/0051977 A1 | 3/2007 | Saito et al. | |
| 2008/0105954 A1* | 5/2008 | Kodama | H01L 29/0634 |
| | | | 257/623 |
| 2014/0197462 A1 | 7/2014 | Briere | |
| 2014/0209975 A1 | 7/2014 | Kamada | |
| 2015/0060943 A1* | 3/2015 | Motonobu | H01L 29/205 |
| | | | 257/192 |
| 2019/0164943 A1* | 5/2019 | Koyama | H01L 25/16 |

FOREIGN PATENT DOCUMENTS

| JP | 2014-146646 A | 8/2014 |
|---|---|---|
| JP | 2014-160807 A | 9/2014 |

\* cited by examiner

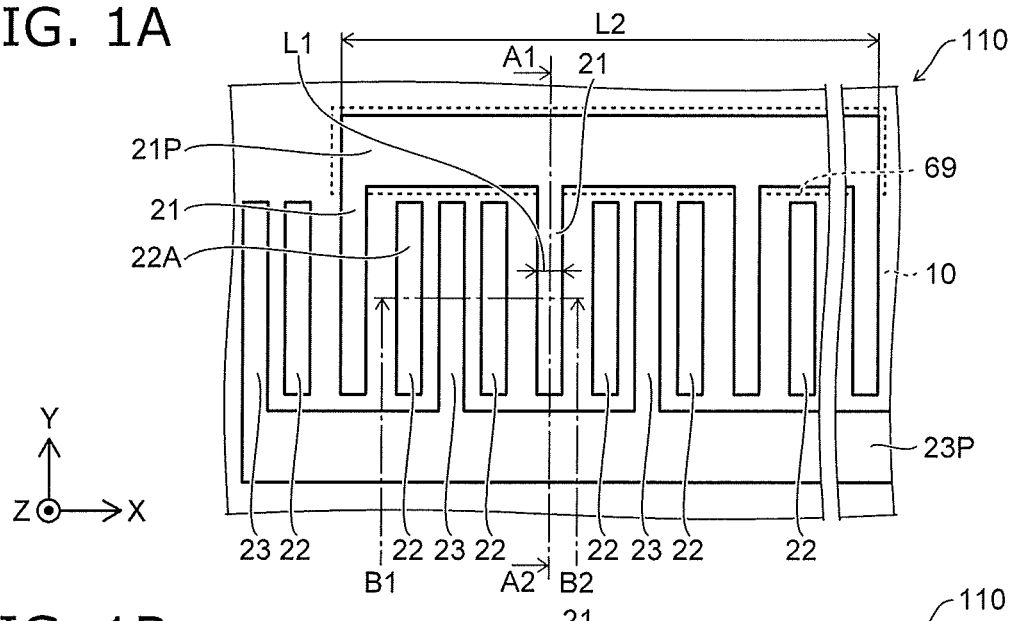
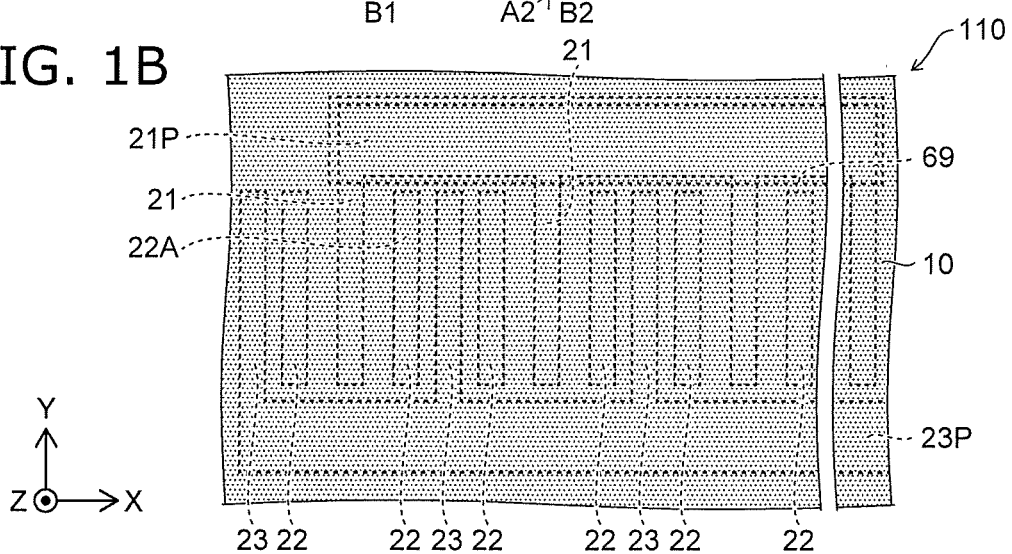
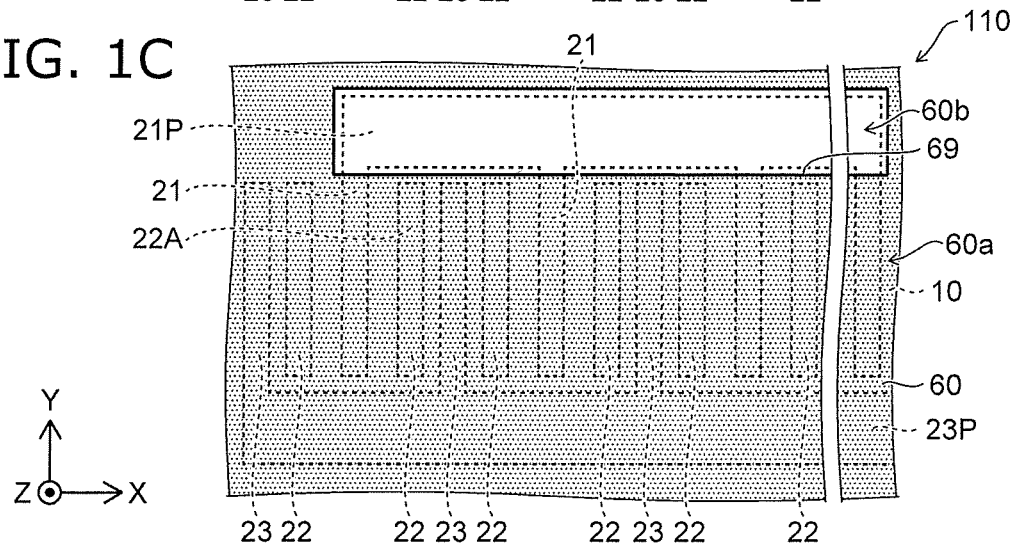

SEMICONDUCTOR DEVICE

CROSS-REFERENCE TO RELATED APPLICATIONS

This application is based upon and claims the benefit of priority from Japanese Patent Application No. 2019-000127, filed on Jan. 4, 2019; the entire contents of which are incorporated herein by reference.

FIELD

Embodiments described herein relate generally to a semiconductor device.

BACKGROUND

It is desirable to reduce the loss in a semiconductor device.

BRIEF DESCRIPTION OF THE DRAWINGS

FIG. 1A to FIG. 1C are schematic views illustrating a semiconductor device according to a first embodiment;

DETAILED DESCRIPTION

Figure 2A:
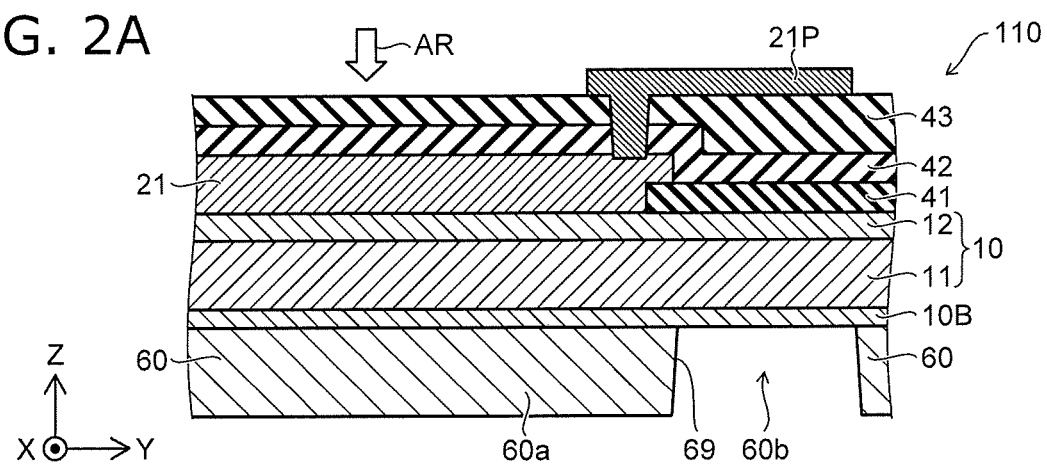
FIG. 2A and FIG. 2B are schematic cross-sectional views illustrating the semiconductor device according to the first embodiment.

According to one embodiment, a semiconductor device includes a first electrode extending along a first direction, a second electrode including a portion extending along the first direction, a third electrode extending along the first direction, a first member, a first semiconductor region, a second semiconductor region, and a conductive portion. A position of the second electrode in a second direction is between a position of the third electrode in the second direction and a position of the first electrode in the second direction. The second direction crosses the first direction. A distance along the second direction between the third electrode and the second electrode is shorter than a distance along the second direction between the second electrode and the first electrode. The first member includes a first region and a second region. A conductivity of the second region is lower than a conductivity of the first region. A direction from the first member toward the first electrode, a direction from the first region toward the second electrode, and a direction from the first region toward the third electrode are aligned with a third direction crossing a plane including the first direction and the second direction. The first semiconductor region includes $Al_{x1}Ga_{1-x1}N$ ($0 \le x1 < 1$) and is provided, in the third direction, between the first member and the first electrode, between the first member and the second electrode, and between the first member and the third electrode. The second semiconductor region includes $Al_{x2}Ga_{1-x2}N$ ($0 < x2 \le 1$ and $x1 < x2$). The first semiconductor region is between the first member and the second semiconductor region in the third direction. A conductive portion is electrically connected to the first electrode. A direction from the second region toward the conductive portion is aligned with the third direction. A length along the second direction of the conductive portion is longer than a length along the second direction of the first electrode.

According to one embodiment, a semiconductor device includes a first electrode extending along a first direction, a second electrode including a portion extending along the first direction, a third electrode extending along the first direction, a first layer, a first member, a first semiconductor region, a second semiconductor region, and a conductive portion. A position of the second electrode in a second direction is between a position of the third electrode in the second direction and a position of the first electrode in the second direction. The second direction crosses the first direction. A distance along the second direction between the third electrode and the second electrode is shorter than a distance along the second direction between the second electrode and the first electrode. The first layer includes a first partial region and a second partial region. A direction from the first layer toward the first electrode, a direction from the first partial region toward the second electrode, and a direction from the first partial region toward the third electrode are aligned with a third direction crossing a plane including the first direction and the second direction. The first member includes a first region. The first region is conductive and is provided, in the third direction, between the first partial region and the second electrode and between the first partial region and the third electrode. The first semiconductor region includes $Al_{x1}Ga_{1-x1}N$ ($0 \le x1 < 1$) and is provided, in the third direction, between the first member and the first electrode, between the first member and the second electrode, and between the first member and the third electrode. The second semiconductor region includes $Al_{x2}Ga_{1-x2}N$ ($0 < x2 \le 1$ and $x1 < x2$). The first semiconductor region is between the first member and the second semiconductor region in the third direction. The conductive portion is electrically connected to the first electrode. A direction from the second partial region toward the conductive portion is aligned with the third direction. A length along the second direction of the conductive portion is longer than a length along the second direction of the first electrode. The first semiconductor region includes a first portion overlapping the conductive portion in the third direction. The first member has a first hole provided between the second partial region and the first portion in the third direction.

According to another embodiment, a semiconductor device includes a first electrode extending along a first direction, a second electrode including a portion extending along the first direction, a third electrode extending along the first direction, a first member, a first semiconductor region, a second semiconductor region, and a conductive member. A position of the second electrode in a second direction is between a position of the third electrode in the second direction and a position of the first electrode in the second direction. The second direction crosses the first direction. A distance along the second direction between the third electrode and the second electrode is shorter than a distance along the second direction between the second electrode and the first electrode. The first member includes a first region and a third region. A conductivity of the third region is lower than a conductivity of the first region. A direction from the third region toward the first electrode, a direction from the first region toward the second electrode, and a direction from the first region toward the third electrode are aligned with a third direction crossing a plane including the first direction and the second direction. The first semiconductor region includes $Al_{x1}Ga_{1-x1}N$ ($0 \le x1 < 1$) and is provided, in the third direction, between the first member and the first electrode, between the first member and the second electrode, and between the first member and the third electrode. The second semiconductor region includes $Al_{x2}Ga_{1-x2}N$ ($0 < x2 \le 1$ and $x1 < x2$). The first semiconductor region in the third direction is between the first member and the second semiconductor region. The conductive member is electrically connected to one of the second electrode or the third electrode. The second electrode is between the first semiconductor region and at least a portion of the conductive member in the third direction. The conductive member includes a connection portion and a first end portion. A direction from the one of the second electrode or the third electrode toward the connection portion is aligned with the third direction. The connection portion is electrically connected to the one of the second electrode or the third electrode. A direction from the connection portion toward the first end portion is aligned with the second direction. A position of the first end portion in the second direction is between a position of the connection portion in the second direction and the position of the first electrode in the second direction. The first region includes a second end portion opposing the third region. A position of the second end portion in the second direction is between the position of the first end portion in the second direction and the position of the first electrode in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 2B:
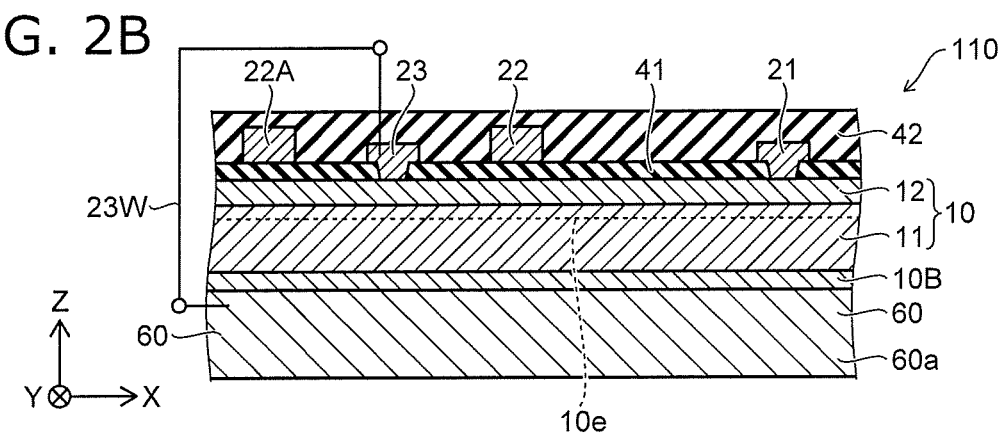

FIG. 1A to FIG. 1C are schematic views illustrating a semiconductor device according to a first embodiment. FIG. 2A and FIG. 2B are schematic cross-sectional views illustrating the semiconductor device according to the first embodiment.

FIG. 1A is a plan view as viewed along arrow AR of FIG. 2A. FIG. 1B and FIG. 1C are plan views of a portion of the components included in the semiconductor device. FIG. 2A is a line A1-A2 cross-sectional view of FIG. 1A. FIG. 2B is a line B1-B2 cross-sectional view of FIG. 1A.

As shown in FIG. 1A and FIG. 2A, the semiconductor device 110 according to the embodiment includes a first electrode 21, a second electrode 22, a third electrode 23, a first member 60, a first semiconductor region 11, a second semiconductor region 12, and a conductive portion 21P.

The first electrode 21 extends along a first direction. The first direction is taken as a Y-axis direction.

One direction perpendicular to the Y-axis direction is taken as an X-axis direction. A direction perpendicular to the Y-axis direction and the X-axis direction is taken as a Z-axis direction.

The second electrode 22 includes a portion extending along the first direction (the Y-axis direction). In the example shown in FIG. 1A, the entire second electrode 22 extends along the first direction. As described below, the end of the second electrode 22 may be curved.

The third electrode 23 extends along the first direction (the Y-axis direction). The position of the second electrode 22 in a second direction crossing the first direction (the Y-axis direction) is between the position of the third electrode 23 in the second direction and the position of the first electrode 21 in the second direction. The second direction is, for example, the X-axis direction.

As shown in FIG. 2B, the distance along the second direction (e.g., the X-axis direction) between the third electrode 23 and the second electrode 22 is shorter than the distance along the second direction between the second electrode 22 and the first electrode 21.

FIG. 1C illustrates the configuration of the first member 60. As shown in FIG. 2A and FIG. 2B, the first member 60 spreads to be substantially parallel to the X-Y plane.

As shown in FIG. 2A, the first member 60 includes a first region 60a and a second region 60b. In one example, the direction from the first region 60a toward the second region 60b is aligned with the first direction (the Y-axis direction). The conductivity of the second region 60b is lower than the conductivity of the first region 60a. The first region 60a is conductive. The first region 60a includes, for example, silicon (a silicon substrate).

In the example, the second region 60b has a hole 69. The hole 69 includes, for example, a hollow. As described below, the second region 60b may include an insulating material.

As shown in FIG. 2B, the direction from the first member 60 toward the first to third electrodes 21 to 23 is aligned with a third direction. The third direction crosses a plane (the X-Y plane) including the first direction and the second direction. The third direction is, for example, the Z-axis direction.

For example, as shown in FIG. 2A, the direction from the first member 60 (in the example, the first region 60a) toward the first electrode 21 is aligned with the third direction (in the example, the Z-axis direction). As shown in FIG. 2B, the direction from the first region 60a toward the second electrode 22 is aligned with the third direction. The direction from the first region 60a toward the third electrode 23 is aligned with the third direction.

As shown in FIG. 2B, the first semiconductor region 11 is provided, in the third direction (e.g., the Z-axis direction), between the first member 60 and the first electrode 21, between the first member 60 and the second electrode 22, and between the first member 60 and the third electrode 23. The first semiconductor region 11 includes $Al_{x1}Ga_{1-x1}N$ ($0 \le x1 < 1$). The composition ratio x1 of Al in the first semiconductor region 11 is, for example, not less than 0 but less than 0.2. The thickness (the length along the Z-axis direction) of the first semiconductor region 11 is, for example, not less than 0.1 μm and not more than 20 μm.

The second semiconductor region 12 includes $Al_{x2}Ga_{1-x2}N$ ($0 < x2 \le 1$ and $x1 < x2$). In the third direction (e.g., the Z-axis direction), the first semiconductor region 11 is between the first member 60 and the second semiconductor region 12. In the example, the second semiconductor region 12 is provided between the second electrode 22 and the first semiconductor region 11 in the third direction (e.g., the Z-axis direction). The composition ratio x2 of Al in the second semiconductor region 12 is, for example, not less than 0.1 and not more than 0.4. The thickness (the length along the Z-axis direction) of the second semiconductor region 12 is, for example, not less than 1 nm and not more than 100 nm.

The first semiconductor region 11 and the second semiconductor region 12 are included in a semiconductor member 10. FIG. 1B illustrates the semiconductor member 10. The semiconductor member 10 spreads to be substantially parallel to the X-Y plane. A buffer layer 10B may be provided between the first member 60 and the semiconductor member 10. The buffer layer 10B may include nitrogen and at least one selected from the group consisting aluminum and gallium.

As shown in FIG. 2A, the conductive portion 21P is electrically connected to the first electrode 21. The direction from the second region 60b toward the conductive portion 21P is aligned with the third direction (e.g., the Z-axis direction).

As shown in FIG. 1A and FIG. 1C, the configuration of the second region 60b is aligned with the configuration of the conductive portion 21P. In the example, the conductive portion 21P extends along the X-axis direction. In such a case, the second region 60b also extends along the X-axis direction.

As shown in FIG. 1A, a length L2 along the second direction (e.g., the X-axis direction) of the conductive portion 21P is longer than a length L1 along the second direction of the first electrode 21.

For example, the first semiconductor region 11 includes a region at the second semiconductor region 12 side. A two-dimensional electron gas 10e is formed in this region (referring to FIG. 2B). For example, the two-dimensional electron gas 10e spreads to be substantially parallel to the X-Y plane. For example, the first semiconductor region 11 functions as an electron transport layer. For example, the second semiconductor region 12 functions as an electron supply layer.

For example, the first electrode 21 corresponds to a drain electrode. For example, the second electrode 22 corresponds to a gate electrode. For example, the third electrode 23 corresponds to a source electrode. The semiconductor device 110 is, for example, a HEMT (High Electron Mobility Transistor). The conductive portion 21P functions as the pad portion of the first electrode 21 (e.g., the drain electrode).

When using the semiconductor device 110 as shown in FIG. 2B, the third electrode 23 may be electrically connected to the first member 60 (the first region 60a). For example, the connection may be performed by wiring 23W, etc. The wiring 23W may be included in the semiconductor device 110.

Loss occurs at turn-off of the semiconductor device 110. It is considered that the loss is caused by the charging energy of the parasitic capacitance of the semiconductor device 110. When operating as recited above, the first member 60 (e.g., the substrate) is set to the potential (the source potential) of the third electrode 23. For example, it is considered that the loss is affected by the capacitance between the drain-source (the capacitance between the drain-substrate), etc.

In addition to the description recited above, the inventor of the application discovered that the drain pad-source capacitance greatly affects the loss. For example, as the surface area of the drain pad (the conductive portion 21P) is increased, the drain pad-source capacitance increases; and the loss increases.

In the embodiment as described above, the second region 60b that has low conductivity is provided at a position corresponding to the conductive portion 21P functioning as the drain pad (referring to FIG. 2A). Thereby, the capacitance (the drain pad-source capacitance) can be reduced markedly compared to the case where the first region 60a that has a high conductivity is provided at the position corresponding to the conductive portion 21P. For example, the electrical capacitance between the conductive portion 21P and the first member 60 can be reduced. The loss can be suppressed thereby. According to the embodiment, a semiconductor device can be provided in which the loss can be reduced.

For example, there is a reference example in which a hollow is provided by removing the substrate positioned under the drain electrode. In the reference example, the drain electrode-source (drain electrode-substrate) capacitance can be reduced. In the actual device, a pad electrode for the drain electrode is provided. Because the surface area of the pad electrode is large, the pad electrode greatly affects the parasitic capacitance.

In the embodiment, by providing the second region 60b (e.g., the hollow) at the position corresponding to the conductive portion 21P, the parasitic capacitance can be reduced more effectively compared to the case where a hollow is provided at the position corresponding to the drain electrode.

As shown in FIG. 1A, an other conductive portion 23P may be provided in the semiconductor device 110. The other conductive portion 23P is electrically connected to the third electrode 23 (e.g., the source electrode). For example, the other conductive portion 23P functions as the pad portion of the third electrode 23 (e.g., the source electrode).

In the example as shown in FIG. 1A, the conductive portion 21P extends along the X-axis direction. Multiple first electrodes 21 are provided in the example. The multiple first electrodes 21 extend in the Y-axis direction. The end portions of the multiple first electrodes 21 are electrically connected to the conductive portion 21P.

In the example as shown in FIG. 1A, the other conductive portion 23P extends along the X-axis direction. Multiple third electrodes 23 are provided in the example. The multiple third electrodes 23 extend in the Y-axis direction. The end portions of the multiple third electrodes 23 are electrically connected to the conductive portion 23P.

The multiple first electrodes 21 have a comb teeth configuration. The multiple third electrodes 23 have a comb teeth configuration. One of the multiple second electrodes 22 is provided between one of the multiple first electrodes 21 and one of the multiple third electrodes 23. As shown in FIG. 1A and FIG. 2B, one of the multiple third electrodes 23 is provided between one of the multiple second electrodes 22 and an other one of the multiple second electrodes 22 (a second electrode 22A).

As shown in FIG. 2B, the semiconductor device 110 may further include an insulating film 41. The insulating film 41 is provided between the second electrode 22 and the first semiconductor region 11. In the example, the insulating film 41 is provided between the second electrode 22 and the second semiconductor region 12. The thickness (the length along the Z-axis direction) of the insulating film 41 is, for example, not less than 1 nm and not more than 200 nm. The insulating film 41 functions as a gate insulating film. As described below, the second electrode 22 may have a trench structure.

As shown in FIG. 2B, the first electrode 21 may contact the first semiconductor region 11. The first electrode 21 may contact the second semiconductor region 12. The first electrode 21 may electrically contact with the first semiconductor region 11. The first electrode 21 may physically contact the second semiconductor region. The third electrode 23 may contact the first semiconductor region 11. The third electrode 23 may contact the second semiconductor region 12.

As shown in FIG. 2A, a portion of the first semiconductor region 11 is provided between the second region 60b and the conductive portion 21P in the third direction (e.g., the Z-axis direction).

As shown in FIG. 2A, an insulating layer (e.g., an insulating layer 42, an insulating layer 43, etc.) may be provided between the second semiconductor region 12 and the conductive portion 21P. The thickness (the length along the Z-axis direction) of the insulating layer 42 is, for example, not less than 0.01 µm and not more than 2 µm. The thickness (the length along the Z-axis direction) of the insulating layer 43 is, for example, not less than 0.01 µm and not more than 2 µm. The insulating film 41 may be provided between the second semiconductor region 12 and the conductive portion 21P.

As shown in FIG. 2B, an electrode (e.g., at least one of the first to third electrodes 21 to 23) may be provided between the insulating layer 42 and the second semiconductor region 12.

For example, the semiconductor device 110 can be formed by forming the semiconductor member 10, the electrodes, etc., on the first member 60 (e.g., the substrate) and by subsequently removing a portion of the first member 60. The removed portion becomes the hole 69, etc. An insulating material may be filled into the removed portion.

Several examples of the semiconductor device according to the embodiment will now be described. The portions of the semiconductor device that are different from the semiconductor device 110 will be described.

Figure 3A:
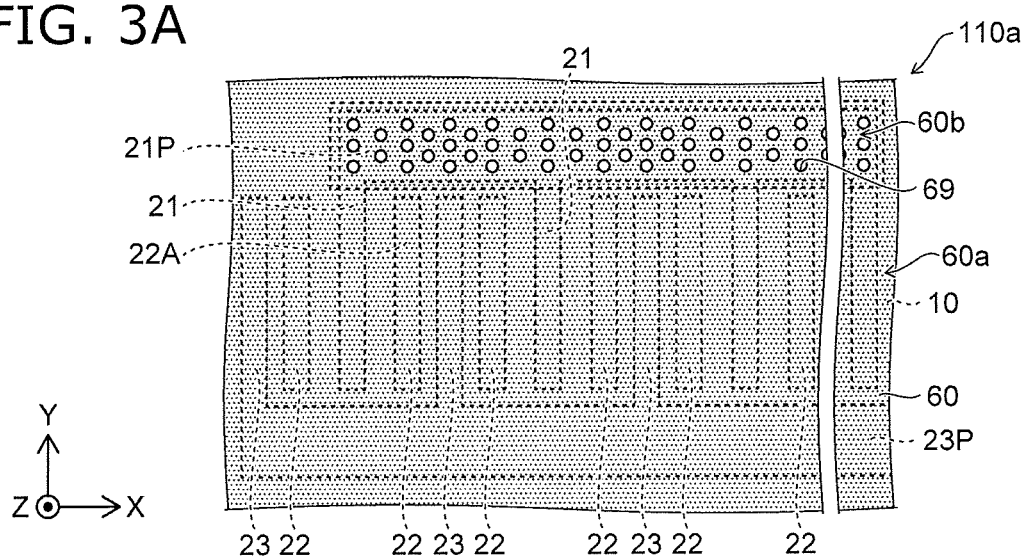
FIG. 3A and FIG. 3B are schematic cross-sectional views illustrating a semiconductor device according to the first embodiment.
Figure 3B:
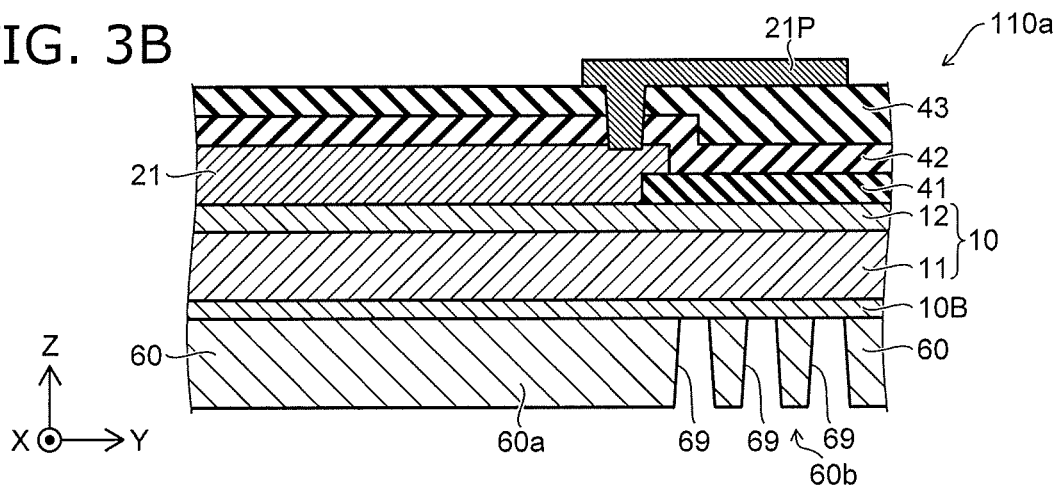

FIG. 3A and FIG. 3B are schematic cross-sectional views illustrating a semiconductor device according to the first embodiment.

FIG. 3A is a plan view corresponding to FIG. 1C. FIG. 3B is a cross-sectional view corresponding to FIG. 2A. In the semiconductor device 110a as shown in FIG. 3A and FIG. 3B, the second region 60b has multiple holes 69. The direction from one of the multiple holes 69 toward an other one of the multiple holes 69 crosses the third direction (e.g., the Z-axis direction). For example, the multiple holes 69 are arranged in the X-Y plane. The conductive portion 21P overlaps the multiple holes 69 in the Z-axis direction. The first semiconductor region 11 is provided between the conductive portion 21P and at least a portion of the multiple holes 69 in the Z-axis direction.

The size of the conductive portion 21P is large. For example, the length (the width) in the Y-axis direction of the conductive portion 21P is, for example, 50 µm or more. Thus, the strength of the semiconductor device may decrease if a large hole 69 is provided under the conductive portion 21P having a large size.

In the case where the multiple holes 69 are provided, for example, a portion of a material similar to the first region 60*a* exists between the multiple holes 69. Thereby, the electrical capacitance can be reduced while suppressing the decrease of the strength of the semiconductor device. The loss can be suppressed.

There are cases where a conductive material enters through the openings of the holes 69; and the desired reduction of the capacitance may not be obtained easily. By providing the multiple small holes 69, the opening of each of the multiple holes 69 is small. The entrance of the conductive material through the openings of the holes 69 is suppressed thereby. The capacitance can be reduced stably. For example, the number of the multiple holes 69 and the size of each of the multiple holes 69 may be determined by the mechanical strength and the amount of the decrease of the capacitance.

Figure 4:
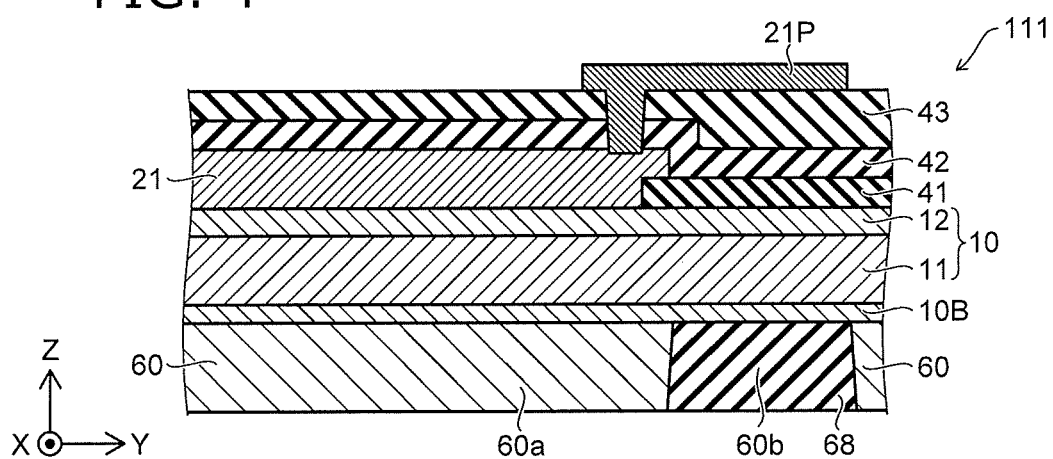
FIG. 4 is a schematic cross-sectional view illustrating a semiconductor device according to the first embodiment.

FIG. 4 is a schematic cross-sectional view illustrating a semiconductor device according to the first embodiment.

FIG. 4 is a cross-sectional view corresponding to FIG. 2A. In the semiconductor device 111 as shown in FIG. 4, the second region 60*b* includes an insulating member 68. The insulating member 68 includes, for example, at least one selected from the group consisting of silicon and aluminum, and at least one selected from the group consisting of oxygen and nitrogen. The insulating member 68 may include, for example, at least one selected from the group consisting of silicon oxide, silicon nitride, and silicon oxynitride. The insulating member 68 may include, for example, an organic substance. The organic substance includes, for example, polyimide, etc. The conductivities of these materials are low. On the other hand, for example, the first region 60*a* includes silicon. In such a case as well, the conductivity of the second region 60*b* is lower than the conductivity of the first region 60*a*. In the semiconductor device 111 as well, the electrical capacitance between the conductive portion 21P and the first member 60 can be reduced. The loss can be suppressed.

For example, in the case where the second region 60*b* has the hole 69 (referring to FIG. 2A), for example, it may be difficult to obtain the desired reduction of the capacitance when a conductive material enters the hole 69 in the mounting process, etc. Conversely, because the second region 60*b* includes the insulating member 68, the capacitance can be reduced stably.

Figure 5:
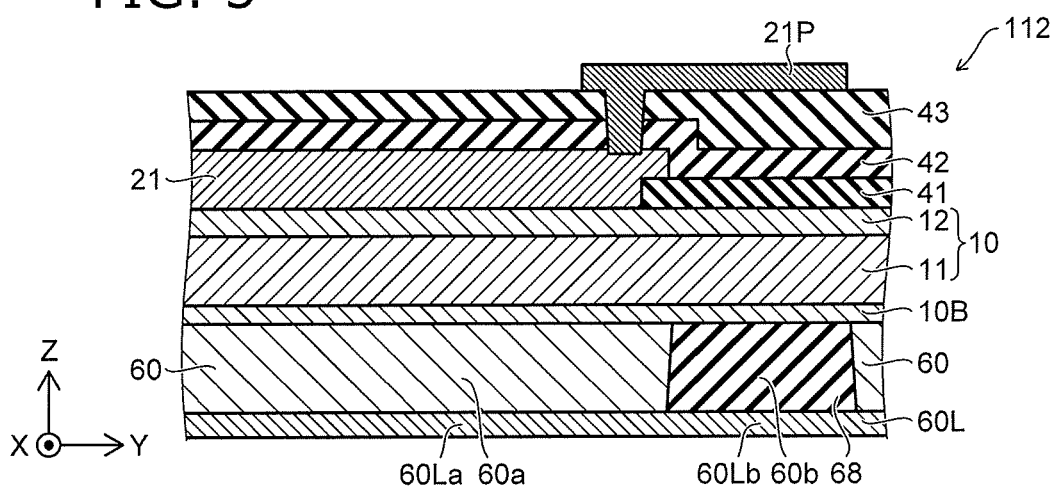
FIG. 5 is a schematic cross-sectional view illustrating a semiconductor device according to the first embodiment.

FIG. 5 is a schematic cross-sectional view illustrating a semiconductor device according to the first embodiment.

FIG. 5 is a cross-sectional view corresponding to FIG. 2A. As shown in FIG. 5, the semiconductor device 112 further includes a first layer 60L. The first layer 60L includes a first partial region 60La and a second partial region 60Lb. The first region 60*a* is provided between the first partial region 60La and the first semiconductor region 11 in the third direction (e.g., the Z-axis direction). The second region 60*b* is provided between the second partial region 60Lb and the first semiconductor region 11 in the third direction. The first layer 60L is, for example, conductive. The first layer 60L may include, for example, a metal. In the semiconductor device 112, the second region 60*b* includes the insulating member 68. For example, the first layer 60L and a mounting substrate (not illustrated) or the like are bonded by a bonding member (e.g., a conductive paste), etc. For example, the mounting is easy.

Figure 6:
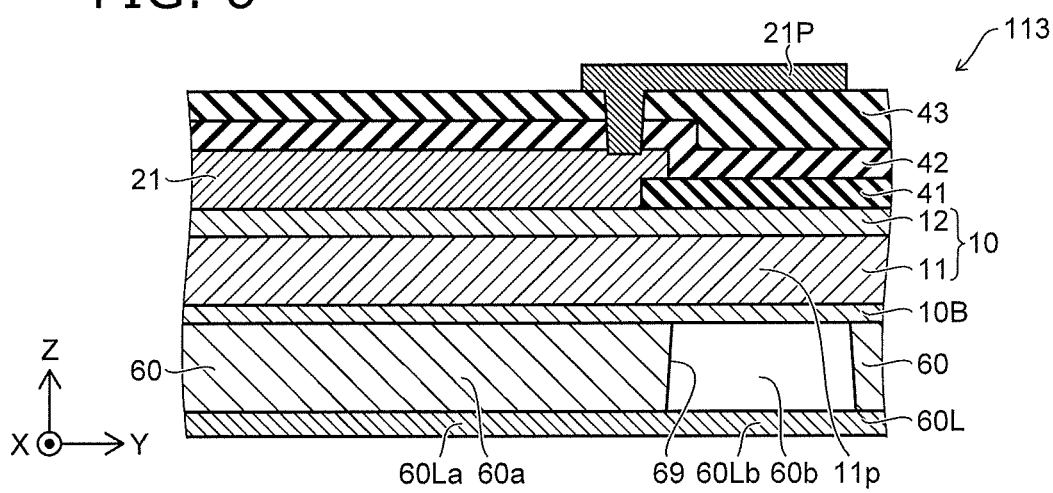
FIG. 6 is a schematic cross-sectional view illustrating a semiconductor device according to the first embodiment.

FIG. 6 is a schematic cross-sectional view illustrating a semiconductor device according to the first embodiment.

FIG. 6 is a cross-sectional view corresponding to FIG. 2A. As shown in FIG. 6, the semiconductor device 113 further includes the first layer 60L. In the semiconductor device 113, the second region 60*b* has the hole 69. For example, the hole 69 may be sealed with the first layer 60L. For example, the opening of the hole 69 can be reduced by the first layer 60L. The entrance of the conductive material (e.g., the conductive paste, etc.) into the hole 69 can be suppressed. Multiple holes 69 may be provided (referring to FIG. 3A and FIG. 3B).

For example, the semiconductor device 110 includes the first to third electrodes 21 to 23 recited above, the first layer 60L recited above, the first semiconductor region 11 recited above, the second semiconductor region 12 recited above, and the first member 60. The first member 60 is provided, in the third direction (the Z-axis direction), between the first partial region 60La and the second electrode 22 and between the first partial region 60La and the third electrode 23. The first member 60 includes the first region 60*a* that is conductive. The first semiconductor region 11 includes a first portion 11*p* overlapping the conductive portion 21P in the third direction (e.g., the Z-axis direction). The first member 60 has a first hole (the hole 69). The first hole (the hole 69) is provided between the second partial region 60Lb and the first portion 11*p* in the third direction (e.g., the Z-axis direction). Multiple holes 69 may be provided (referring to FIG. 3A and FIG. 3B).

Figure 7:
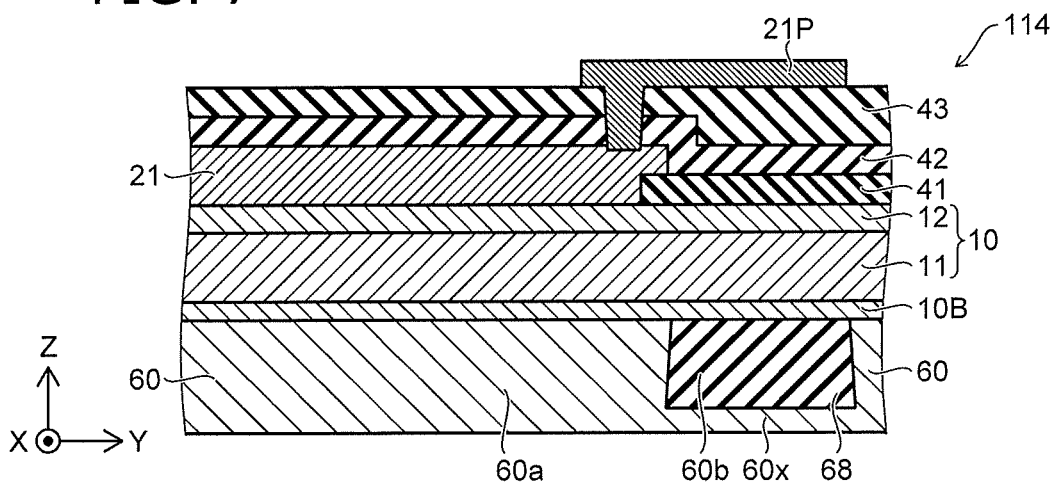
FIG. 7 is a schematic cross-sectional view illustrating a semiconductor device according to the first embodiment.

FIG. 7 is a schematic cross-sectional view illustrating a semiconductor device according to the first embodiment.

FIG. 7 is a cross-sectional view corresponding to FIG. 2A. In the semiconductor device 114 as shown in FIG. 7, the first member 60 further includes an overlap region 60*x* in addition to the first region 60*a* and the second region 60*b*. The second region 60*b* is provided between the overlap region 60*x* and the first semiconductor region 11 in the third direction (e.g., the Z-axis direction).

The conductivity of the overlap region 60*x* is higher than the conductivity of the second region 60*b*. The conductivity of the overlap region 60*x* may be substantially the same as the conductivity of the first region 60*a*. The overlap region 60*x* may be continuous with the first region 60*a*. The first member 60 includes, for example, silicon. The first member 60 may include a metal.

In the semiconductor device 114, the second region 60*b* includes the insulating member 68. In the semiconductor device 114, the second region 60*b* may have the hole 69. Multiple holes 69 may be provided. In the semiconductor device 114, the first layer 60L may be further provided. For example, the first layer 60L may be conductive.

Figure 8:
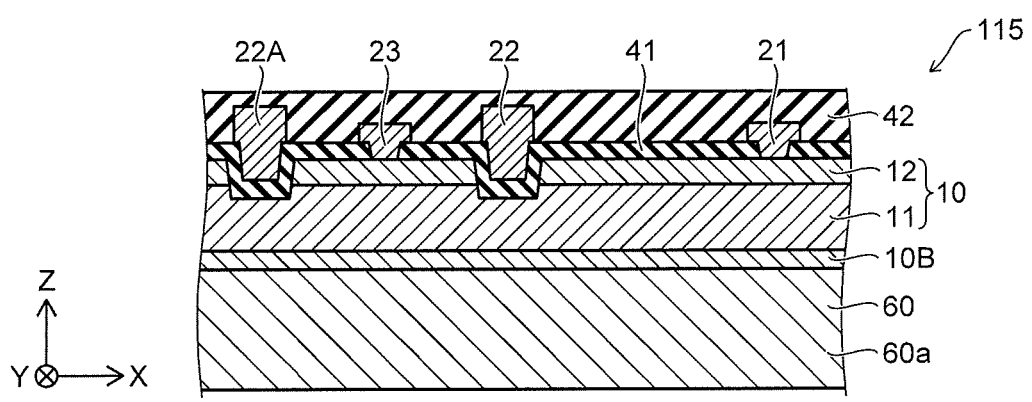
FIG. 8 is a schematic cross-sectional view illustrating a semiconductor device according to the first embodiment.

FIG. 8 is a schematic cross-sectional view illustrating a semiconductor device according to the first embodiment.

FIG. 8 is a cross-sectional view corresponding to FIG. 2B. In the semiconductor device 115 as shown in FIG. 8, the direction from a portion of the second electrode 22 toward the second semiconductor region 12 is aligned with the X-axis direction. For example, the direction from a portion of the insulating film 41 toward the first semiconductor region 11 is aligned with the X-axis direction. The direction from a portion of the second electrode 22 toward the first semiconductor region 11 may be aligned with the X-axis direction. In the semiconductor device 115, the second electrode 22 is of the trench-gate type. A normally-off characteristic is obtained in the semiconductor device 115. In the semiconductor device 115, the second region 60*b* may include the insulating member 68.

In the semiconductor devices 112 to 115 as well, the electrical capacitance between the conductive portion 21P and the first member 60 can be reduced. The loss can be suppressed.

Second Embodiment

Figure 9A:
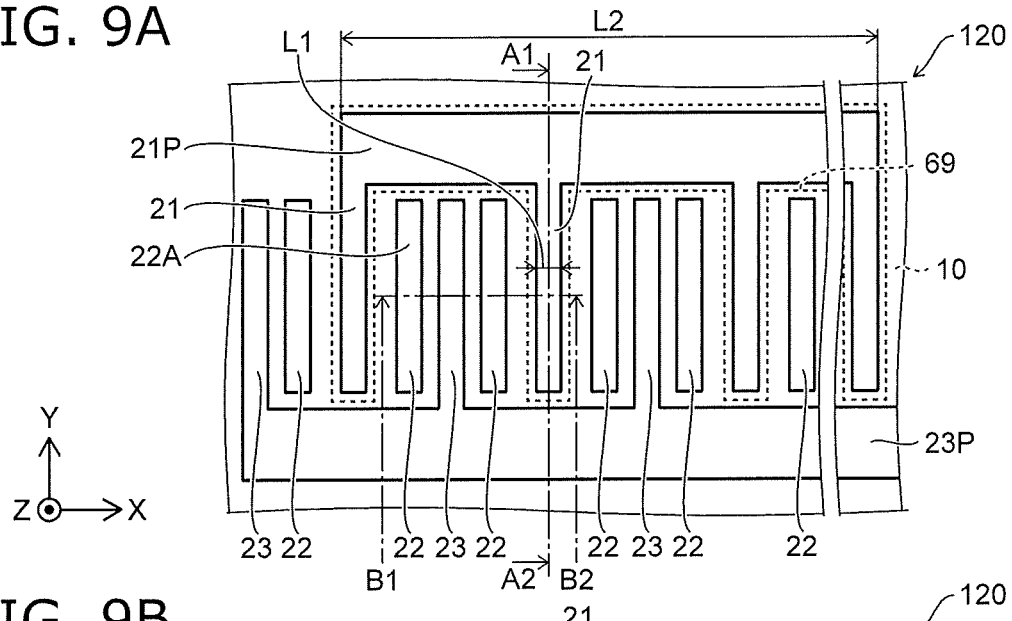
FIG. 9A to FIG. 9C are schematic views illustrating a semiconductor device according to a second embodiment.
Figure 9B:
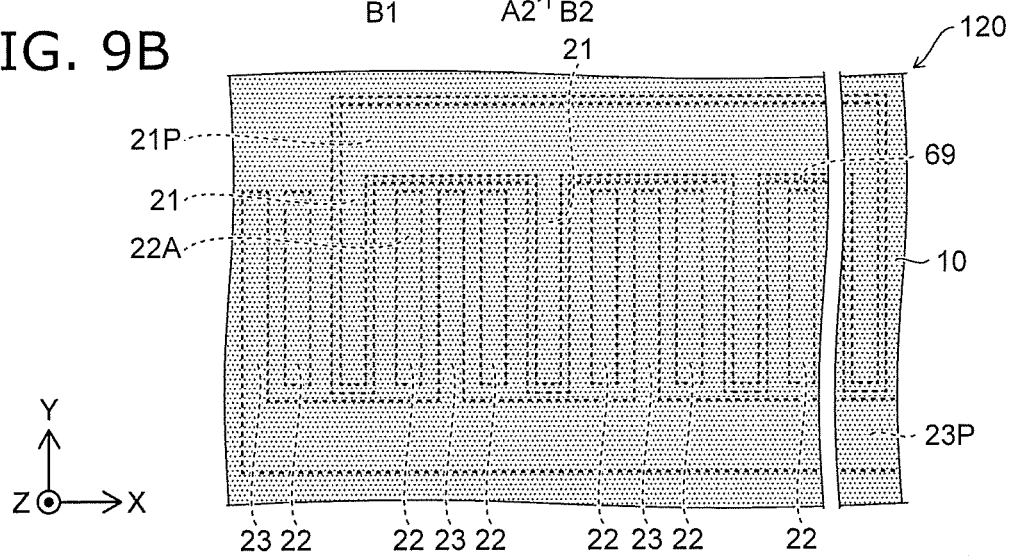
Figure 9C:
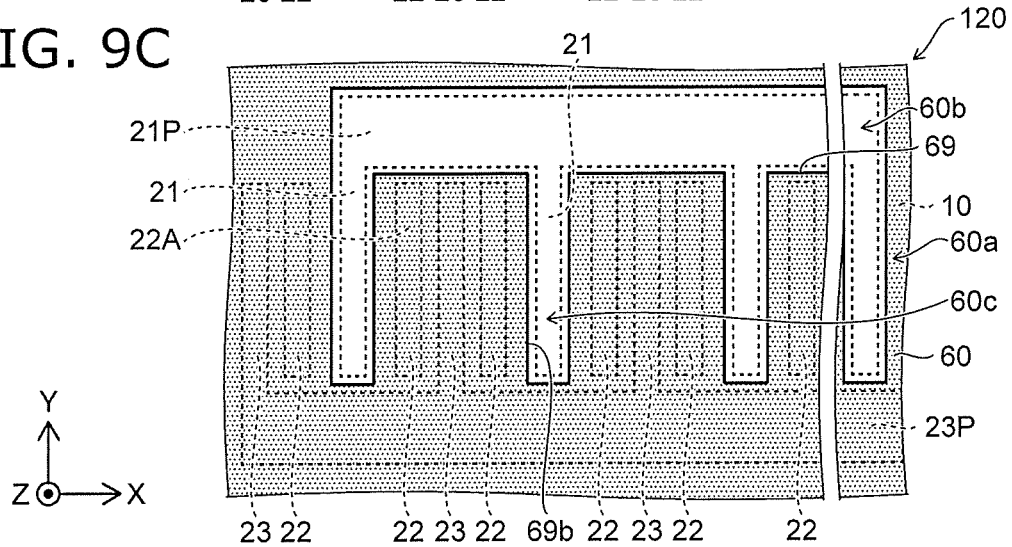
Figure 10A:
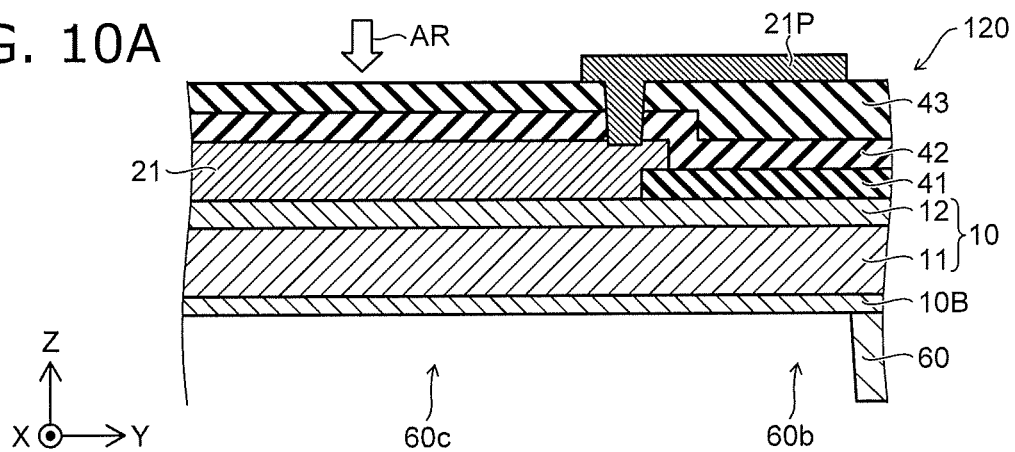
FIG. 10A and FIG. 10B are schematic cross-sectional views illustrating the semiconductor device according to the second embodiment.
Figure 10B:
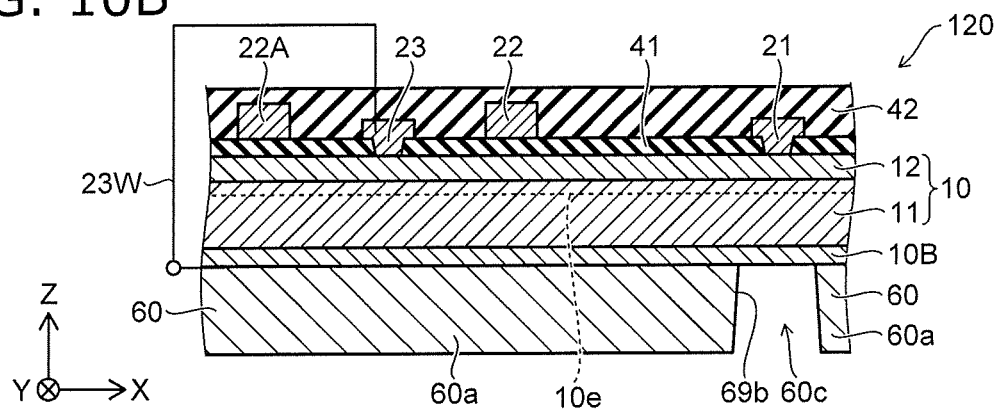

FIG. 9A to FIG. 9C are schematic views illustrating a semiconductor device according to a second embodiment. FIG. 10A and FIG. 10B are schematic cross-sectional views illustrating the semiconductor device according to the second embodiment.

FIG. 9A is a plan view as viewed along arrow AR of FIG. 10A. FIG. 9B and FIG. 9C are plan views of a portion of the components included in the semiconductor device. FIG. 10A is a line A1-A2 cross-sectional view of FIG. 9A. FIG. 10B is a line B1-B2 cross-sectional view of FIG. 9A.

As shown in FIG. 9A and FIG. 10A, the semiconductor device 120 according to the embodiment also includes the first electrode 21, the second electrode 22, the third electrode 23, the first member 60, the first semiconductor region 11, the second semiconductor region 12, and the conductive portion 21P. In the semiconductor device 120 as shown in FIG. 9B and FIG. 10B, the first member 60 further includes a third region 60c in addition to the first region 60a and the second region 60b described above. Otherwise, the configuration of the semiconductor device 120 may be similar to that of the semiconductor device 110. An example of the first member 60 of the semiconductor device 120 will now be described.

In the semiconductor device 120, the first member 60 further includes the third region 60c. The conductivity of the third region 60c is lower than the conductivity of the first region 60a. The conductivity of the third region 60c may be the same as the conductivity of the second region 60b. As shown in FIG. 10B, the direction from the third region 60c toward the first electrode 21 is aligned with the third direction (e.g., the Z-axis direction).

The second region 60b and the third region 60c may be linked to each other or may be separated from each other. In the example, the second region 60b has the hole 69 (the first hole). The third region 60c has a hole 69b (a second hole). The hole 69 and the hole 69b may be linked to each other or may be separated from each other. Multiple holes 69 may be provided (referring to FIG. 3A and FIG. 3B). Multiple holes 69b may be provided. For example, the multiple holes 69b may be arranged along the Y-axis direction.

As shown in FIG. 9A and FIG. 9C, the configuration of the third region 60c is aligned with the configuration of the first electrode 21. For example, the first electrode 21 extends along the Y-axis direction. In such a case, the third region 60c also extends along the Y-axis direction.

In the semiconductor device 120, the capacitance between the first electrode 21 and the first member 60 is reduced in addition to reducing the capacitance between the conductive portion 21P and the first member 60. The loss can be reduced further thereby.

Figure 11A:
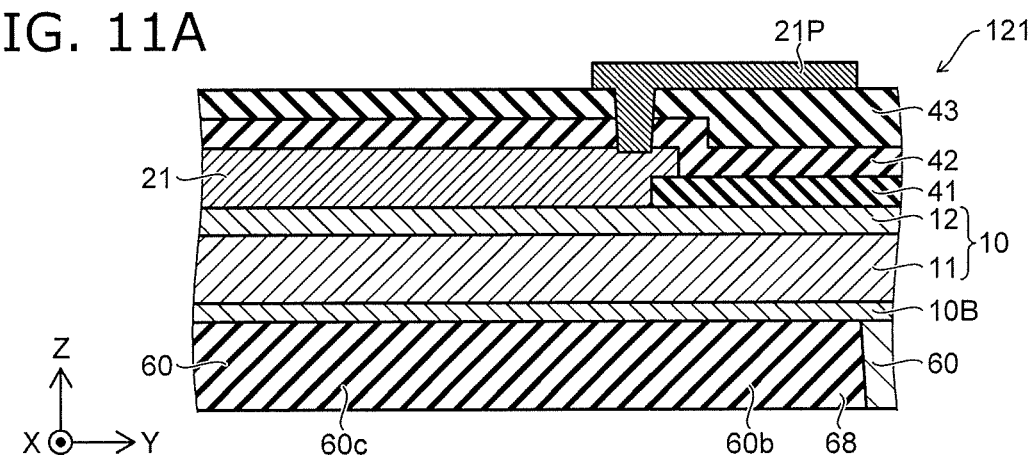
FIG. 11A and FIG. 11B are schematic cross-sectional views illustrating a semiconductor device according to the second embodiment.
Figure 11B:
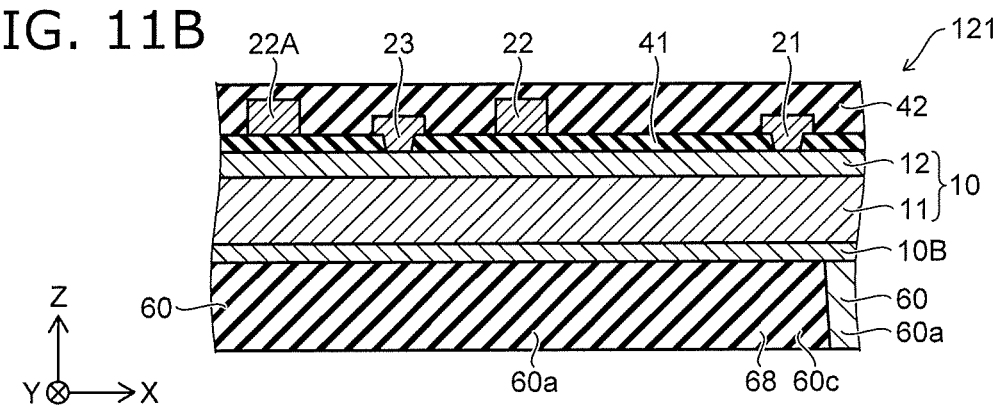

FIG. 11A and FIG. 11B are schematic cross-sectional views illustrating a semiconductor device according to the second embodiment.

FIG. 11A and FIG. 11B are cross-sectional views corresponding respectively to FIG. 10A and FIG. 10B. In the semiconductor device 121 as shown in FIG. 11A and FIG. 11B, the second region 60b and the third region 60c include the insulating member 68. The insulating member 68 of the second region 60b and the insulating member 68 of the third region 60c may be linked to each other or may be separated from each other.

Figure 12A:
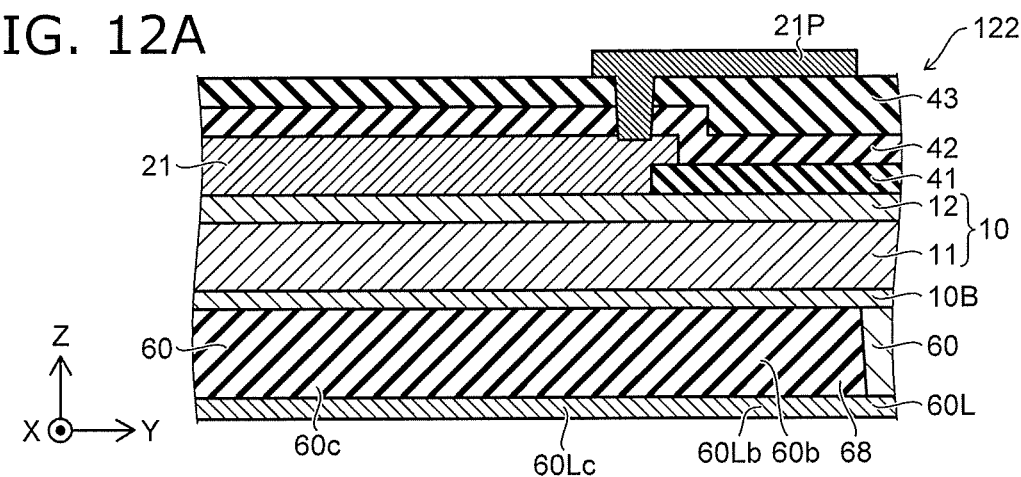
FIG. 12A and FIG. 12B are schematic cross-sectional views illustrating a semiconductor device according to the second embodiment.
Figure 12B:
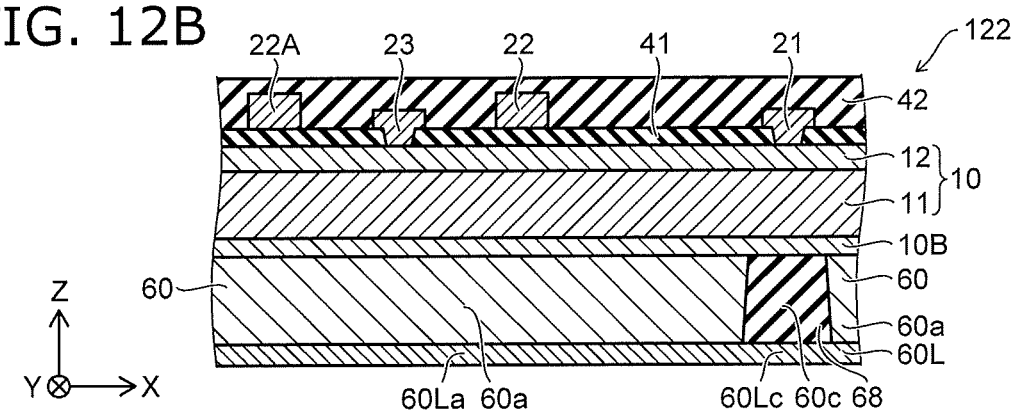

FIG. 12A and FIG. 12B are schematic cross-sectional views illustrating a semiconductor device according to the second embodiment.

FIG. 12A and FIG. 12B are cross-sectional views corresponding respectively to FIG. 10A and FIG. 10B. As shown in FIG. 12A and FIG. 12B, the semiconductor device 122 includes the first layer 60L. As shown in FIG. 12B, the first layer 60L further includes a third partial region 60Lc in addition to the first partial region 60La and the second partial region 60Lb. The third region 60c may be provided between the third partial region 60Lc and the first electrode 21 in the third direction (the Z-axis direction). In the example, the third region 60c includes the insulating member 68. For example, the first layer 60L and a mounting substrate (not illustrated) are bonded by a bonding member (e.g., a conductive paste), etc. For example, the mounting is easy.

Figure 13A:
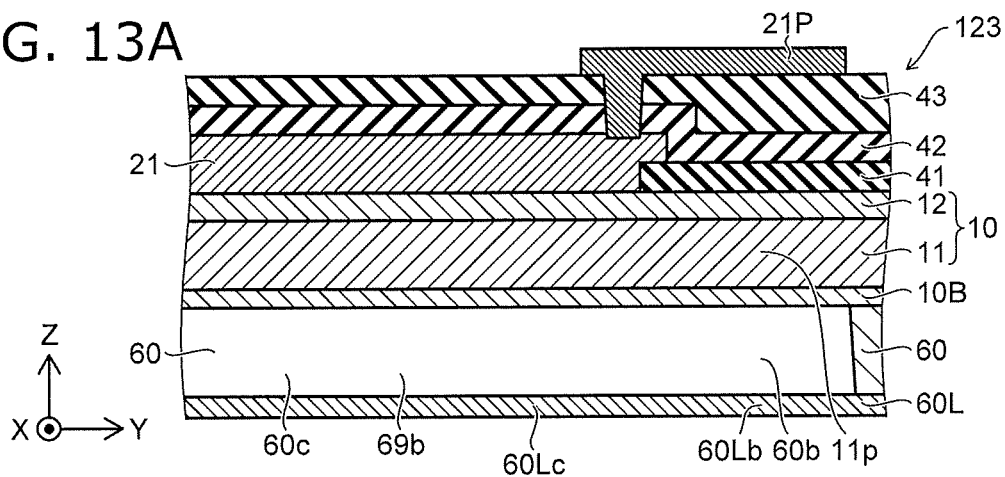
FIG. 13A and FIG. 13B are schematic cross-sectional views illustrating a semiconductor device according to the second embodiment.
Figure 13B:
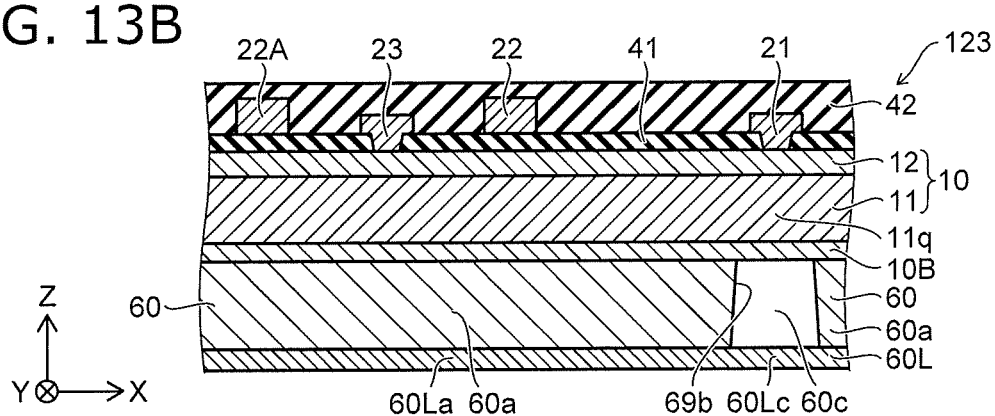

FIG. 13A and FIG. 13B are schematic cross-sectional views illustrating a semiconductor device according to the second embodiment.

FIG. 13A and FIG. 13B are cross-sectional views corresponding respectively to FIG. 10A and FIG. 10B. As shown in FIG. 13A and FIG. 13B, the semiconductor device 123 also includes the first layer 60L. The first layer 60L includes the third partial region 60Lc. The first semiconductor region 11 further includes a second portion 11q (referring to FIG. 13B) in addition to the first portion 11p (referring to FIG. 13A). The second portion 11q overlaps the first electrode 21 in the third direction (the Z-axis direction). The first member 60 has the hole 69b (the second hole). The hole 69b is provided between the third partial region 60Lc and the second portion 11q in the third direction (e.g., the Z-axis direction).

For example, the hole 69 and the hole 69b are sealed with the first layer 60L. For example, the openings of the hole 69 and the hole 69b can be reduced by the first layer 60L. The entrance of the conductive material (e.g., the conductive paste, etc.) into the hole 69 and the hole 69b can be suppressed. Multiple holes 69 may be provided. Multiple holes 69b may be provided.

Figure 14A:
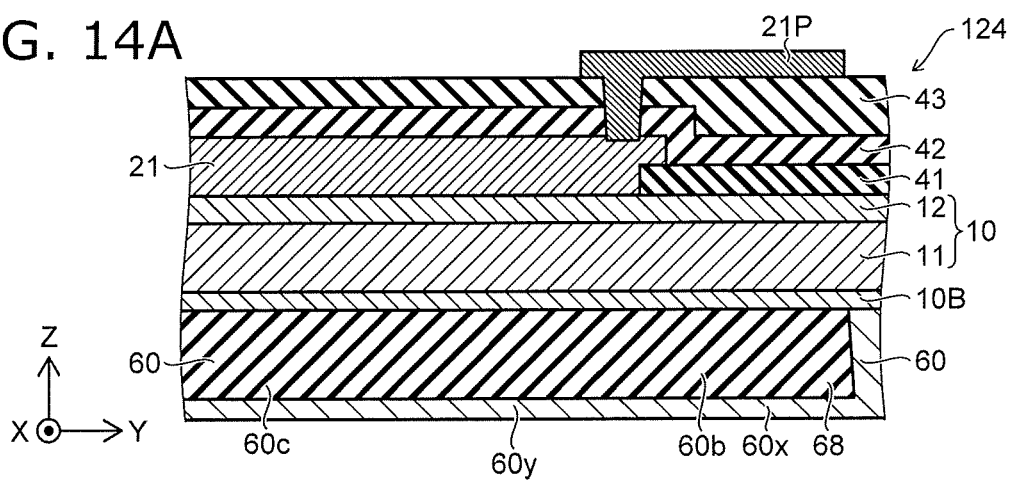
FIG. 14A and FIG. 14B are schematic cross-sectional views illustrating a semiconductor device according to the second embodiment.
Figure 14B:
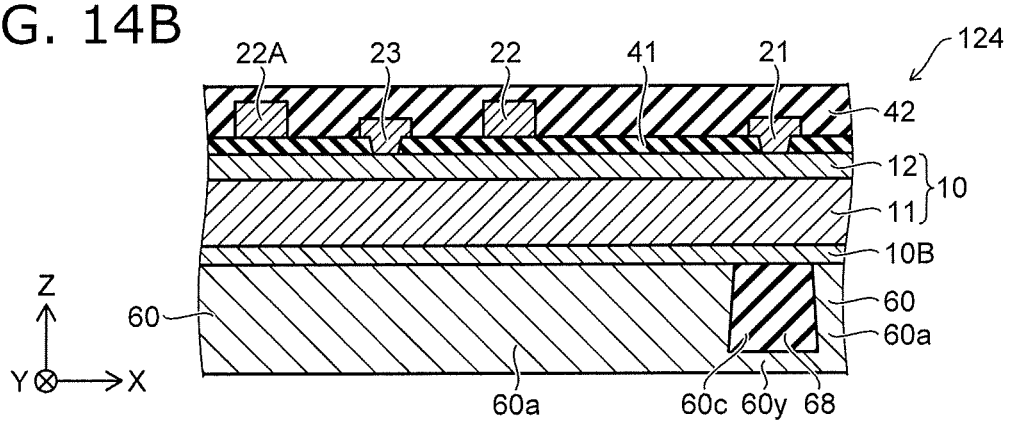

FIG. 14A and FIG. 14B are schematic cross-sectional views illustrating a semiconductor device according to the second embodiment.

FIG. 14A and FIG. 14B are cross-sectional views corresponding respectively to FIG. 10A and FIG. 10B. In the semiconductor device 124 as shown in FIG. 14A and FIG. 14B, the first member 60 further includes the overlap region 60x and an overlap region 60y in addition to the first region 60a and the second region 60b.

As shown in FIG. 14A, the second region 60b is provided between the overlap region 60x and the first semiconductor region 11 in the third direction (e.g., the Z-axis direction).

As shown in FIG. 14B, the third region 60c is provided between the overlap region 60y and the first semiconductor region 11 in the third direction (e.g., the Z-axis direction).

The conductivity of the overlap region 60y is higher than the conductivity of the third region 60c. The conductivity of the overlap region 60y may be substantially the same as the conductivity of the first region 60a. The overlap region 60y may be continuous with the first region 60a. The first member 60 includes, for example, silicon. The first member 60 may include a metal.

In the semiconductor device 124, the second region 60b and the third region 60c include the insulating member 68. In the semiconductor device 124, the second region 60b may have the hole 69. The third region 60c may have the hole 69b. Multiple holes 69 may be provided. Multiple holes 69b may be provided. In the semiconductor device 124, the first layer 60L may be further provided.

Figure 15A:
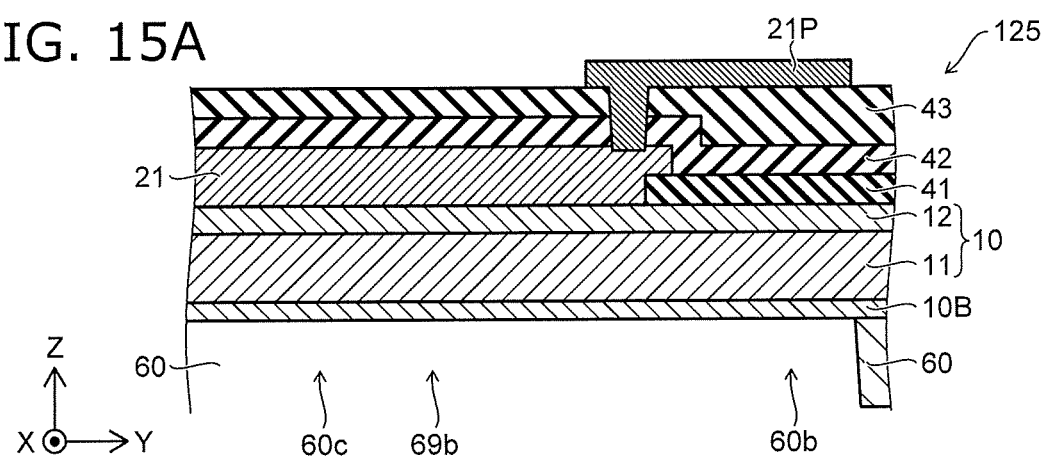
FIG. 15A and FIG. 15B are schematic cross-sectional views illustrating a semiconductor device according to the second embodiment.
Figure 15B:
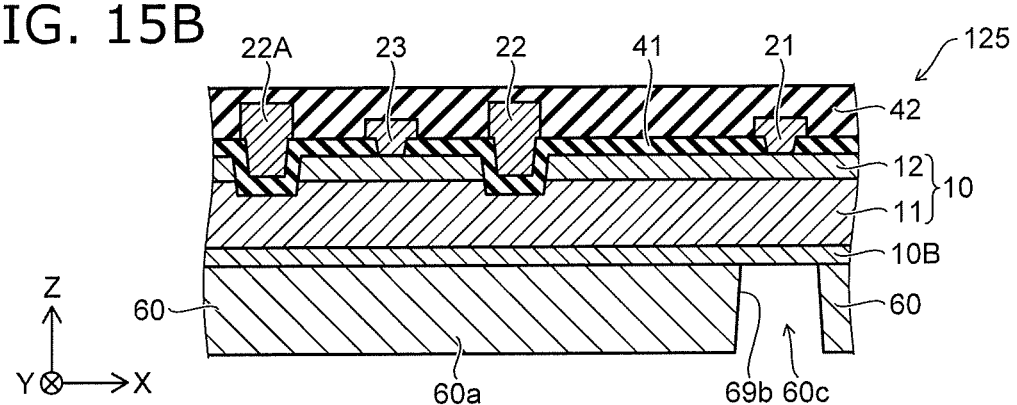

FIG. 15A and FIG. 15B are schematic cross-sectional views illustrating a semiconductor device according to the second embodiment.

FIG. 15A and FIG. 15B are cross-sectional views corresponding respectively to FIG. 10A and FIG. 10B. In the semiconductor device 125 as shown in FIG. 15A and FIG. 15B, the direction from a portion of the second electrode 22 toward the second semiconductor region 12 is aligned with the X-axis direction. For example, the direction from a portion of the insulating film 41 toward the first semiconductor region 11 is aligned with the X-axis direction. The direction from a portion of the second electrode 22 toward the first semiconductor region 11 may be aligned with the X-axis direction. In the semiconductor device 125, the second electrode 22 is of the trench-gate type. A normally-off characteristic is obtained in the semiconductor device 125. In the semiconductor device 125, the second region 60b and the third region 60c may include the insulating member 68.

In the semiconductor devices 122 to 125 as well, the electrical capacitance between the conductive portion 21P and the first member 60 can be reduced. The electrical capacitance between the first electrode 21 and the first member 60 also can be reduced. The loss can be suppressed.

Third Embodiment

Figure 16A:
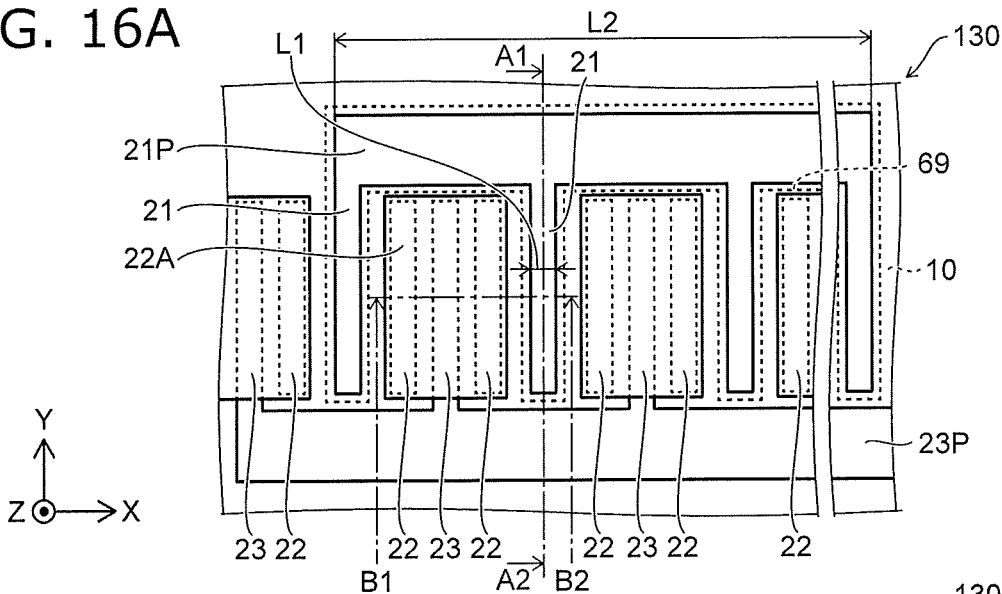
FIG. 16A to FIG. 16C are schematic views illustrating a semiconductor device according to a third embodiment.
Figure 16B:
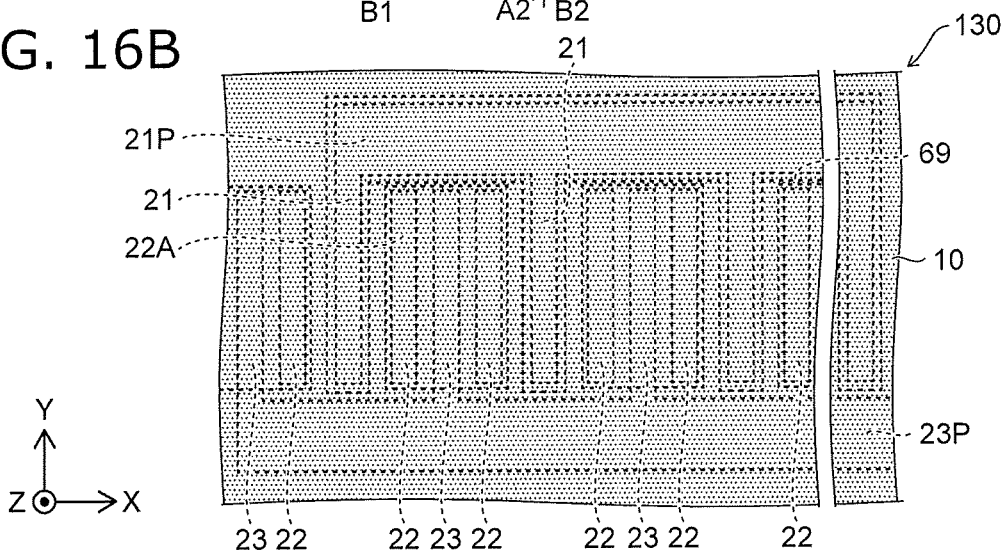
Figure 16C:
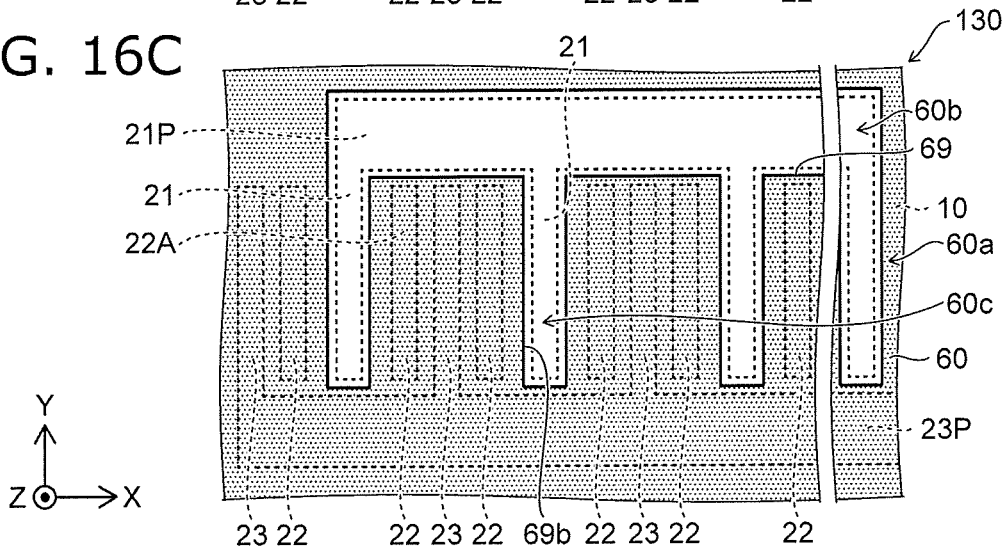

FIG. 16A to FIG. 16C are schematic views illustrating a semiconductor device according to a third embodiment.

Figure 17A:
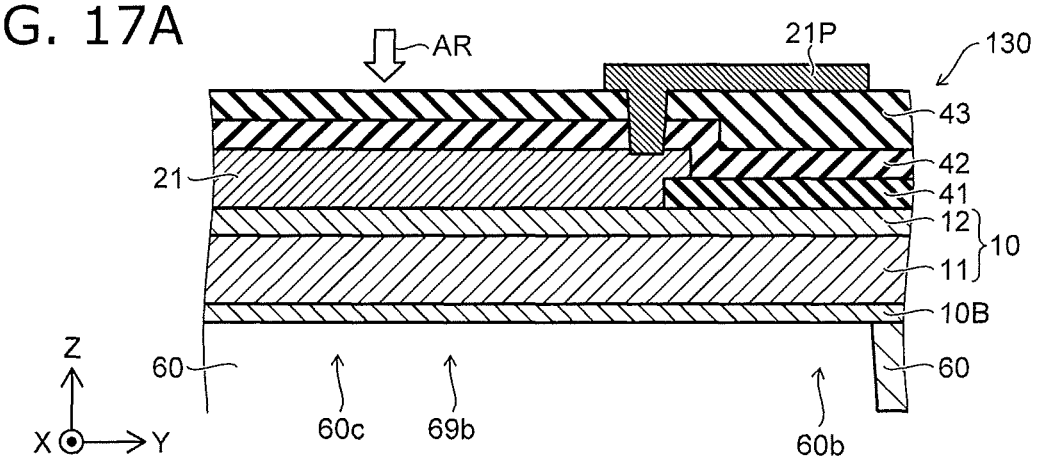
FIG. 17A and FIG. 17B are schematic cross-sectional views illustrating the semiconductor device according to the third embodiment.
Figure 17B:
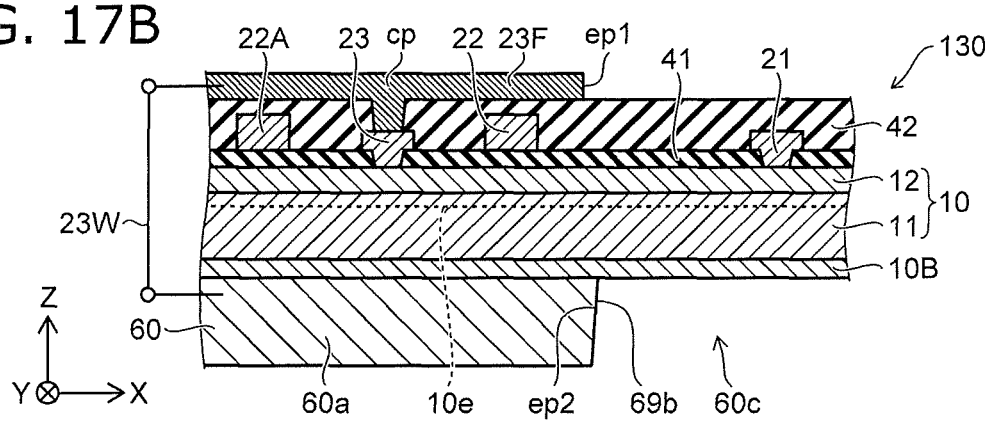

FIG. 17A and FIG. 17B are schematic cross-sectional views illustrating the semiconductor device according to the third embodiment.

FIG. 16A is a plan view as viewed along arrow AR of FIG. 17A. FIG. 16B and FIG. 16C are plan views of a portion of the components included in the semiconductor device. FIG. 17A is a line A1-A2 cross-sectional view of FIG. 16A. FIG. 17B is a line B1-B2 cross-sectional view of FIG. 16A.

As shown in FIG. 16A and FIG. 17A, the semiconductor device 130 according to the embodiment includes a conductive member (a first conductive member 23F) in addition to the first electrode 21, the second electrode 22, the third electrode 23, the first member 60, the first semiconductor region 11, the second semiconductor region 12, and the conductive portion 21P. Also, the third region 60c is provided in the first member 60; and the position of the end portion of the third region 60c is different from that of the semiconductor device 120. Otherwise, the configuration of the semiconductor device 130 may be similar to that of the semiconductor device 120. An example of the first conductive member 23F and the first member 60 of the semiconductor device 130 will now be described.

As shown in FIG. 17B, the first conductive member 23F is electrically connected to the third electrode 23. The second electrode 22 is between the first semiconductor region 11 and at least a portion of the first conductive member 23F in the third direction (e.g., the Z-axis direction).

The first conductive member 23F includes a connection portion cp and a first end portion ep1. The direction from the third electrode 23 toward the connection portion cp is aligned with the third direction (e.g., the Z-axis direction). The connection portion cp is electrically connected to the third electrode 23. The direction from the connection portion cp toward the first end portion ep1 is aligned with the second direction (e.g., the X-axis direction). For example, the connection portion cp is electrically connected to the third electrode 23 at any position in the Y-axis direction.

The position of the first end portion ep1 in the second direction (e.g., the X-axis direction) is between the position of the connection portion cp in the second direction and the position of the first electrode 21 in the second direction.

The first conductive member 23F is, for example, a field plate on the source side.

As shown in FIG. 17B, the first region 60a includes a second end portion ep2 opposing the third region 60c. The position of the second end portion ep2 in the second direction (e.g., the X-axis direction) is between the position of the first end portion ep1 in the second direction and the position of the first electrode 21 in the second direction. For example, the second end portion ep2 does not overlap the first conductive member 23F in the Z-axis direction.

For example, the position of the first end portion ep1 in the second direction (e.g., the X-axis direction) is between the position of the second electrode 22 in the second direction and the position of the first electrode 21 in the second direction.

By providing the first conductive member 23F, the concentration of the electric field in the region proximal to the end of the second electrode 22 is relaxed. As described above, when in use, the first member 60 is set to the potential of the source (the third electrode 23). On the other hand, the first conductive member 23F is electrically connected to the third electrode 23. The first end portion ep1 and the first member 60 are set to substantially the same potential. For example, the concentration of the electric field in the region between the second end portion ep2 and the second electrode 22 is suppressed.

Because the position of the second end portion ep2 is between the position of the first end portion ep1 in the second direction and the position of the first electrode 21 in the second direction, the capacitance between the first electrode 21 and the first member 60 can be reduced while suppressing the concentration of the electric field. The loss can be suppressed while suppressing the concentration of the electric field.

Also, in the operating state, a depleted region is formed by the drain voltage (e.g., 400 V, etc.) inside the semiconductor member 10. The depleted region is between the second electrode 22 and the first electrode 21 in the X-axis direction. There is an undepleted region between the first electrode 21 and the depleted region. In the switching operation, the undepleted region substantially does not contribute to the electric field relaxation. The undepleted region causes a loss.

Therefore, it is more favorable for the second region 60b having the low conductivity to overlap the undepleted region in the Z-axis direction. The position of the boundary between the undepleted region and the depleted region changes according to the operating conditions (e.g., the drain voltage, etc.). Practically, for example, the position of the boundary may be at substantially the middle in the X-axis direction between the first end portion ep1 and the first electrode 21.

For example, the distance (a first distance) in the second direction between the position in the second direction (e.g., the X-axis direction) of the first end portion ep1 and the position in the second direction of the second end portion ep2 may be not more than 4/5 of the distance (a second distance) in the second direction between the position in the second direction of the first end portion ep1 and the position in the second direction of the first electrode 21. The first distance may be not less than 1/10 of the second distance. The capacitance can be reduced more effectively while suppressing the concentration of the electric field.

In the semiconductor device 130, in the case where the third region 60c has the hole 69, the second end portion ep2 corresponds to the side portion of the hole 69 of which the position in the X-axis direction is most proximal to the second electrode 22. As described below, in the case where the third region 60c includes the insulating member 68, the second end portion ep2 corresponds to the side portion of the insulating member 68 of which the position in the X-axis direction is most proximal to the second electrode 22.

Figure 18A:
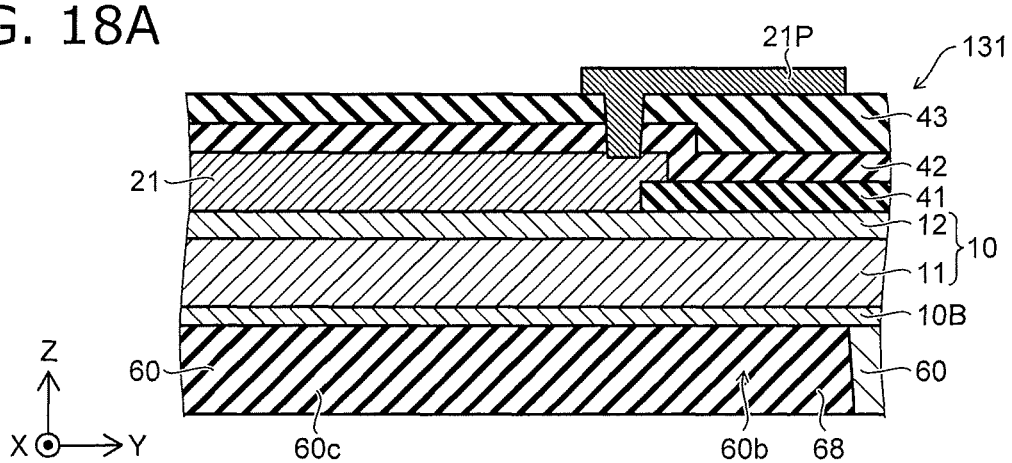
FIG. 18A and FIG. 18B are schematic cross-sectional views illustrating a semiconductor device according to the third embodiment.
Figure 18B:
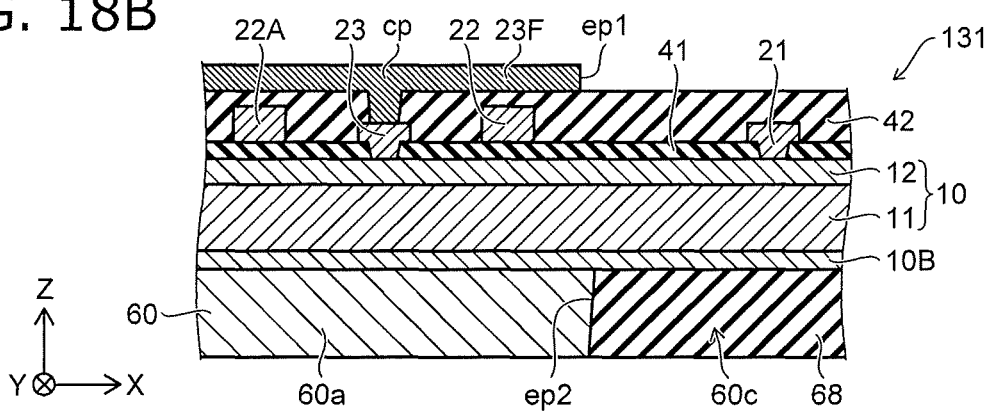

FIG. 18A and FIG. 18B are schematic cross-sectional views illustrating a semiconductor device according to the third embodiment.

FIG. 18A and FIG. 18B are cross-sectional views corresponding respectively to FIG. 17A and FIG. 17B. In the semiconductor device 131 as shown in FIG. 18A and FIG. 18B, the second region 60b and the third region 60c include the insulating member 68. The insulating member 68 of the second region 60b and the insulating member 68 of the third region 60c may be linked to each other or may be separated from each other.

Figure 19A:
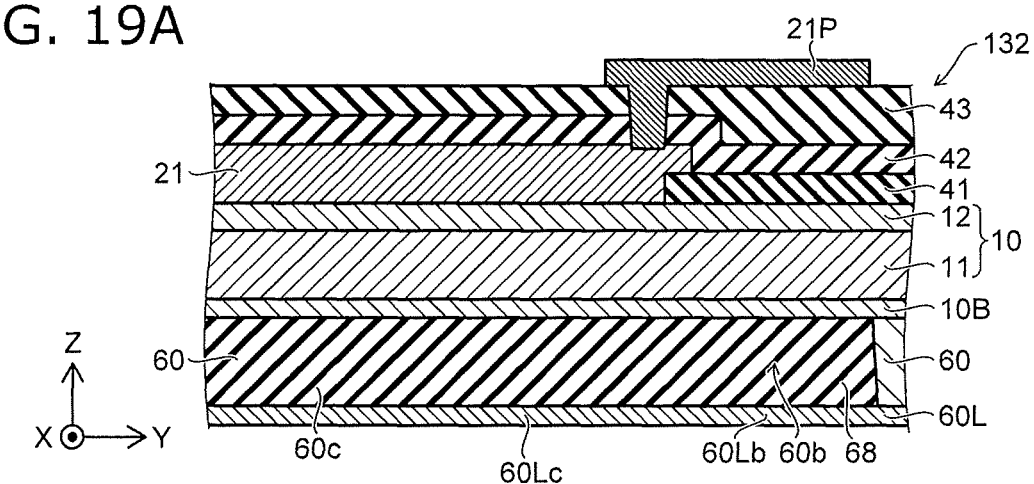
FIG. 19A and FIG. 19B are schematic cross-sectional views illustrating a semiconductor device according to the third embodiment.
Figure 19B:
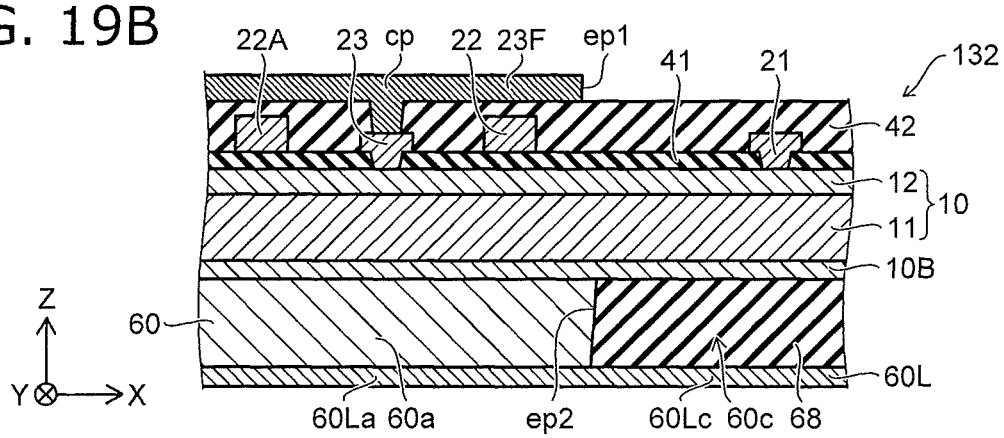

FIG. 19A and FIG. 19B are schematic cross-sectional views illustrating a semiconductor device according to the third embodiment.

FIG. 19A and FIG. 19B are cross-sectional views corresponding respectively to FIG. 17A and FIG. 17B. As shown in FIG. 19A and FIG. 19B, the semiconductor device 132 includes the first layer 60L. As shown in FIG. 19B, the first layer 60L further includes the third partial region 60Lc in addition to the first partial region 60La and the second partial region 60Lb. The third region 60c may be provided between the third partial region 60Lc and the first electrode 21 in the third direction (the Z-axis direction). In the example, the third region 60c includes the insulating member 68. For example, the mounting is easy due to the first layer 60L.

Figure 20A:
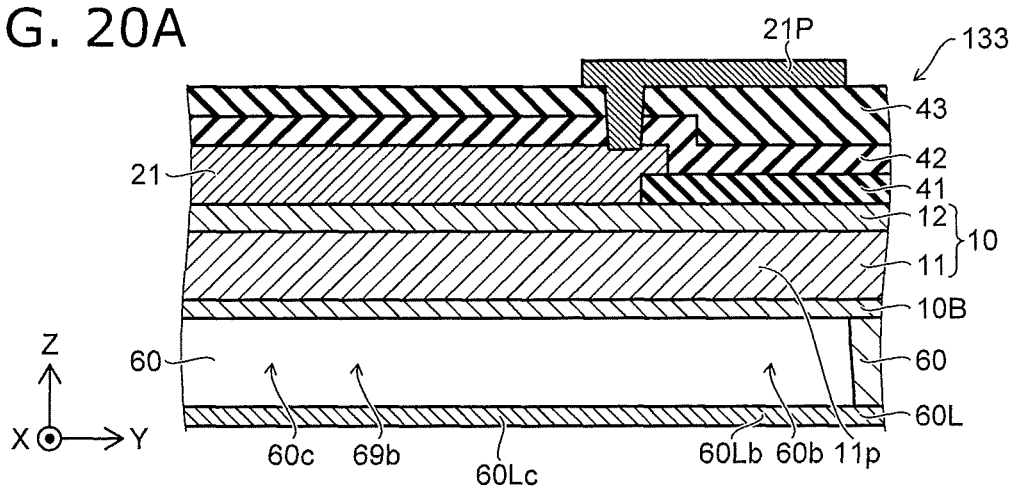
FIG. 20A and FIG. 20B are schematic cross-sectional views illustrating a semiconductor device according to the third embodiment.
Figure 20B:
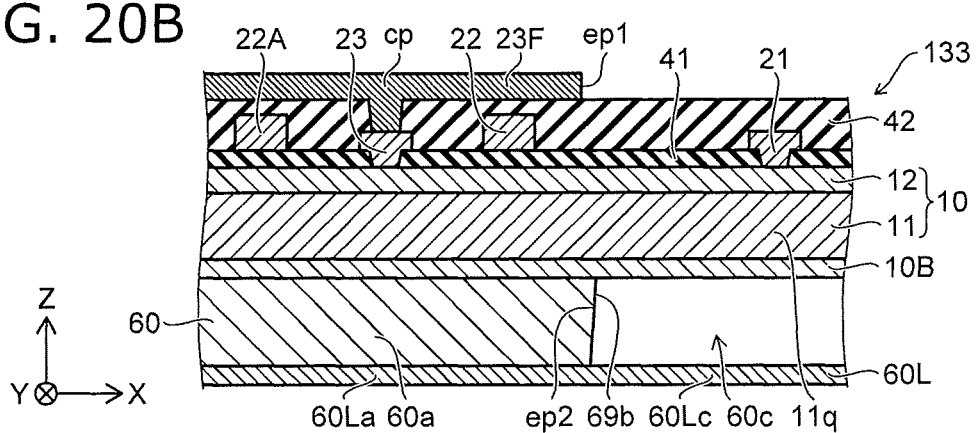

FIG. 20A and FIG. 20B are schematic cross-sectional views illustrating a semiconductor device according to the third embodiment.

FIG. 20A and FIG. 20B are cross-sectional views corresponding respectively to FIG. 17A and FIG. 17B. As shown in FIG. 20A and FIG. 20B, the semiconductor device 133 also includes the first layer 60L. The first layer 60L includes the third partial region 60Lc. The first semiconductor region 11 includes the first portion 11p and the second portion 11q. The second portion 11q overlaps the first electrode 21 in the third direction (the Z-axis direction). The first member 60 has the hole 69b (the second hole). The hole 69b is provided between the third partial region 60Lc and the second portion 11q in the third direction (e.g., the Z-axis direction).

For example, the entrance of the conductive material (e.g., the conductive paste, etc.) into the hole 69 and the hole 69b can be suppressed. Multiple holes 69 may be provided. Multiple holes 69b may be provided.

In the semiconductor device 133, the second end portion ep2 opposes the hole 69b (the second hole).

Figure 21A:
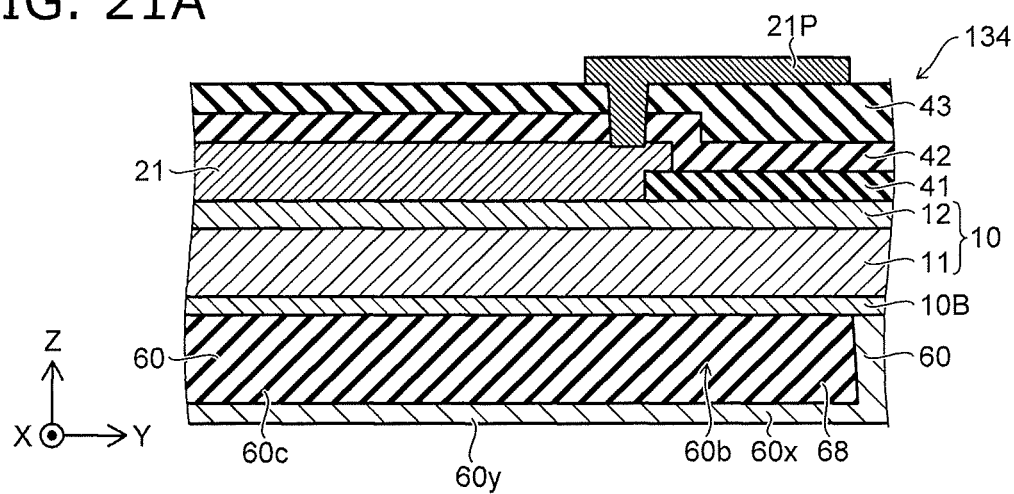
FIG. 21A and FIG. 21B are schematic cross-sectional views illustrating a semiconductor device according to the third embodiment.
Figure 21B:
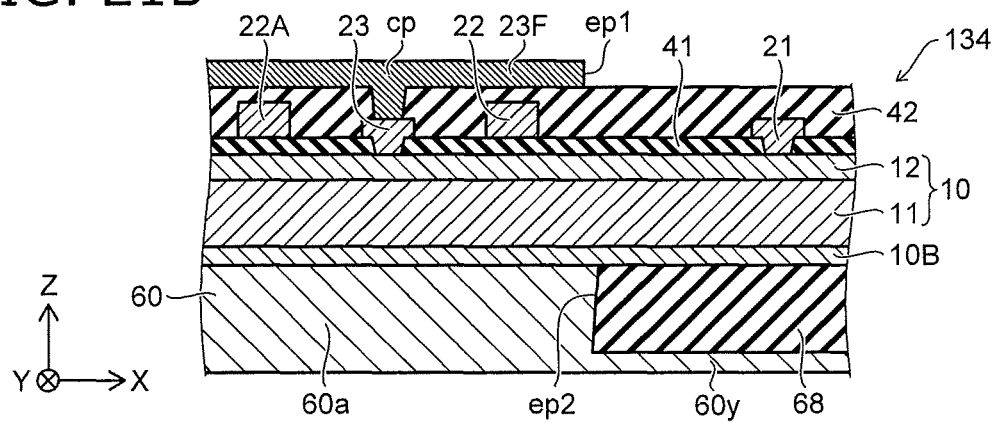

FIG. 21A and FIG. 21B are schematic cross-sectional views illustrating a semiconductor device according to the third embodiment.

FIG. 21A and FIG. 21B are cross-sectional views corresponding respectively to FIG. 17A and FIG. 17B. In the semiconductor device 134 as shown in FIG. 21A and FIG. 21B, the first member 60 further includes the first region 60a, the second region 60b, the overlap region 60x, and the overlap region 60y. The second region 60b is provided between the overlap region 60x and the first semiconductor region 11 in the Z-axis direction. The third region 60c is provided between the overlap region 60y and the first semiconductor region 11 in the Z-axis direction. The conductivity of the overlap region 60y is higher than the conductivity of the third region 60c. In the semiconductor device 134, the second region 60b may have the hole 69. The third region 60c may have the hole 69b. Multiple holes 69 may be provided. Multiple holes 69b may be provided. In the semiconductor device 134, the first layer 60L may be further provided.

Figure 22A:
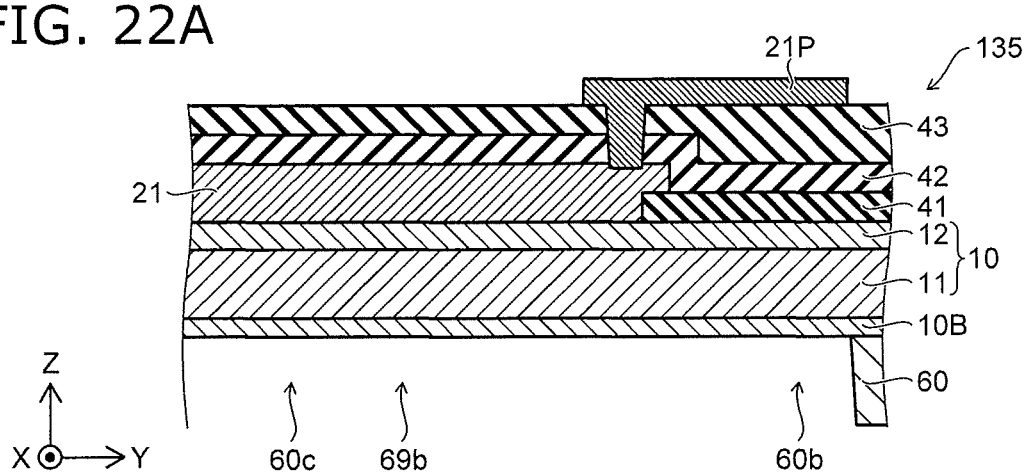
FIG. 22A and FIG. 22B are schematic cross-sectional views illustrating a semiconductor device according to the third embodiment.
Figure 22B:
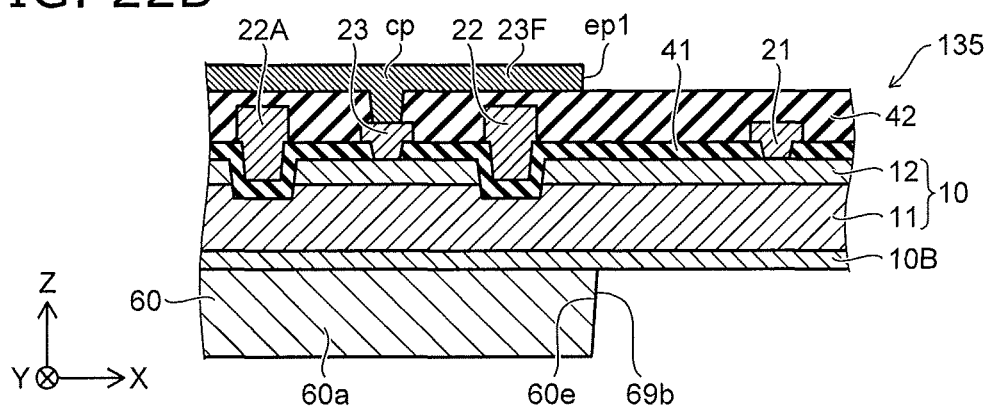

FIG. 22A and FIG. 22B are schematic cross-sectional views illustrating a semiconductor device according to the third embodiment.

FIG. 22A and FIG. 22B are cross-sectional views corresponding respectively to FIG. 17A and FIG. 17B. In the semiconductor device 135 as shown in FIG. 22A and FIG. 22B, the direction from a portion of the second electrode 22 toward the second semiconductor region 12 is aligned with the X-axis direction. In the semiconductor device 135, the second region 60b and the third region 60c may include the insulating member 68.

In the semiconductor devices 131 to 135 as well, for example, the position of the first end portion ep1 in the second direction (e.g., the X-axis direction) is between the position of the second electrode 22 in the second direction and the position of the first electrode 21 in the second direction. The loss can be suppressed while suppressing the concentration of the electric field.

Figure 23A:
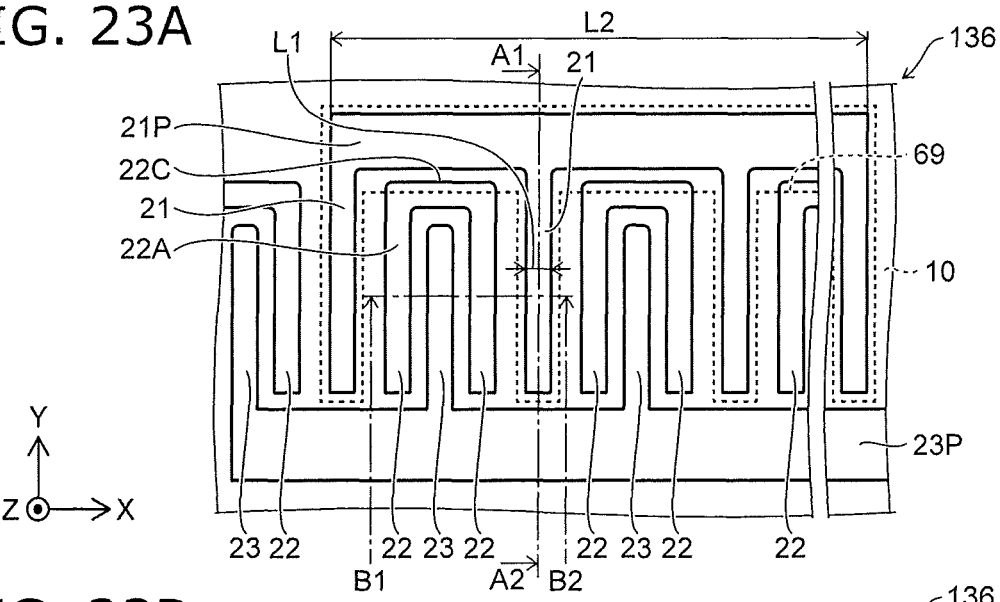
FIG. 23A to FIG. 23C are schematic views illustrating a semiconductor device according to the third embodiment.
Figure 23B:
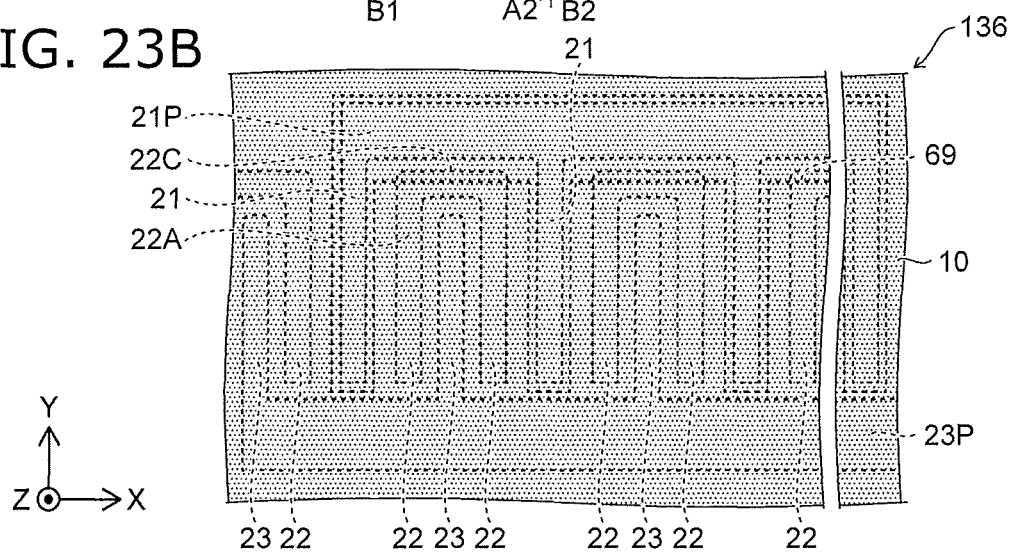
Figure 23C:
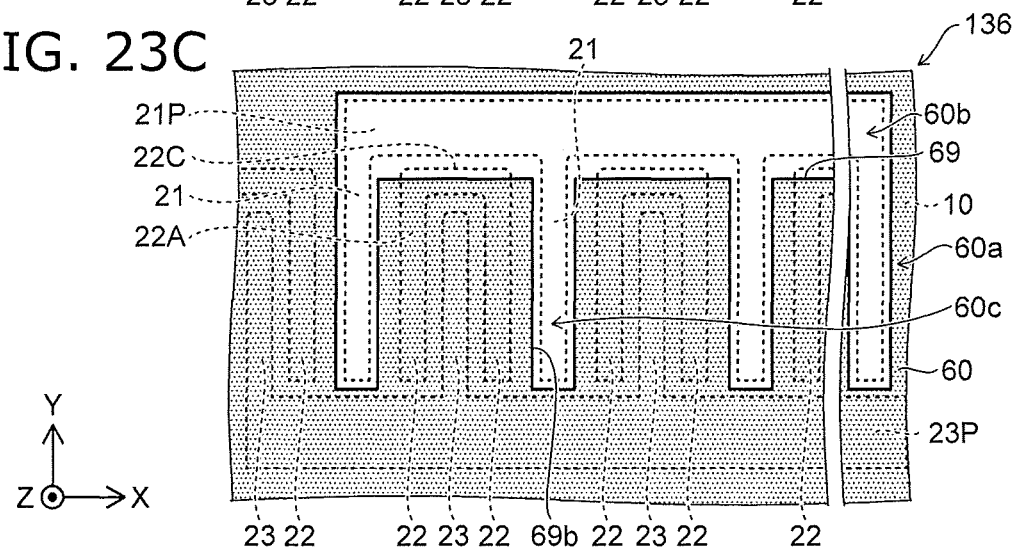

FIG. 23A to FIG. 23C are schematic views illustrating a semiconductor device according to the third embodiment.

FIG. 23A to FIG. 23C are schematic views corresponding respectively to FIG. 16A to FIG. 16C.

As shown in FIG. 23A, the semiconductor device 136 further includes a connecting conductive portion 22C. Otherwise, the configuration of the semiconductor device 136 may be the same as the configuration of the semiconductor device 130.

As shown in FIG. 23A, multiple second electrodes 22 are provided. The third electrode 23 is provided between one of the multiple second electrodes 22 and an other one of the multiple second electrodes 22 (the second electrode 22A). The connecting conductive portion 22C electrically connects the end of the one of the multiple second electrodes 22 recited above and the end of the other one (the second electrode 22A) of the multiple second electrodes 22 recited above. In the example, the end of the second electrode 22 may be curved.

In the example shown in FIG. 23A and FIG. 23C, the second region 60b overlaps the connecting conductive portion 22C in the third direction (the Z-axis direction).

The connecting conductive portion 22C substantially may not function as a gate. Therefore, the second region 60b may overlap the connecting conductive portion 22C in the third direction (the Z-axis direction). For example, the second region 60b may overlap the region between the connecting conductive portion 22C and the first electrode 21 in the Z-axis direction. The precision of the manufacturing and the design of the position of the second region 60b is relaxed. The loss can be reduced while maintaining the ease of manufacturing.

Multiple holes 69 may be provided in the semiconductor device 136. The hole 69b may be omitted. The first layer 60L may be provided. At least one of the overlap region 60x or the overlap region 60y may be provided.

Figure 24A:
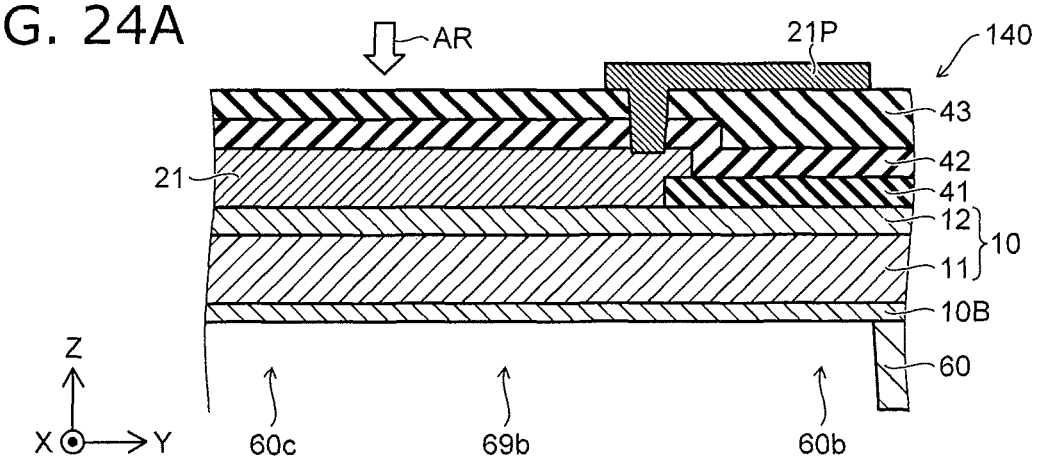
FIG. 24A and FIG. 24B are schematic cross-sectional views illustrating a semiconductor device according to the third embodiment.
Figure 24B:
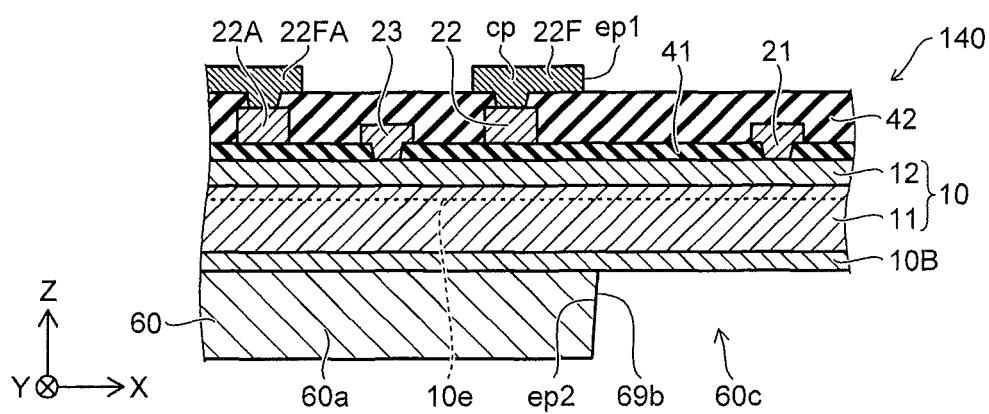
Figure 25A:
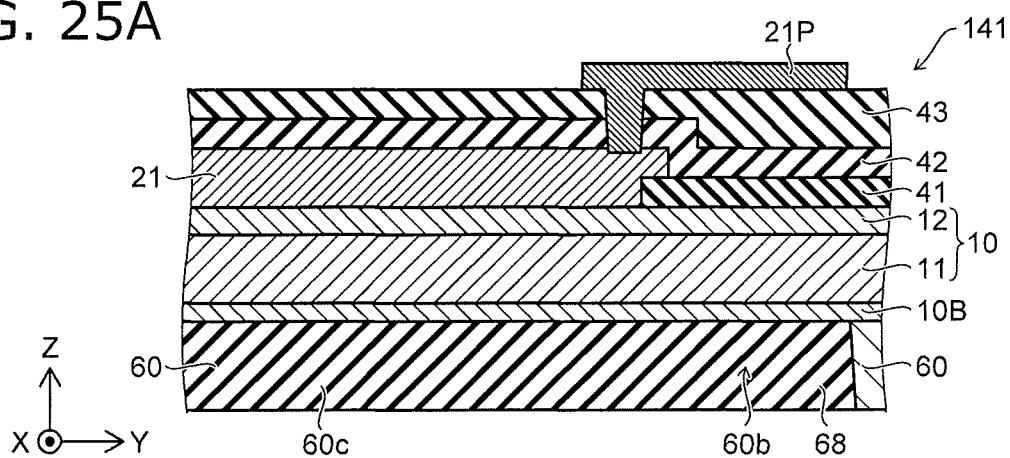
FIG. 25A and FIG. 25B are schematic cross-sectional views illustrating a semiconductor device according to the third embodiment.
Figure 25B:
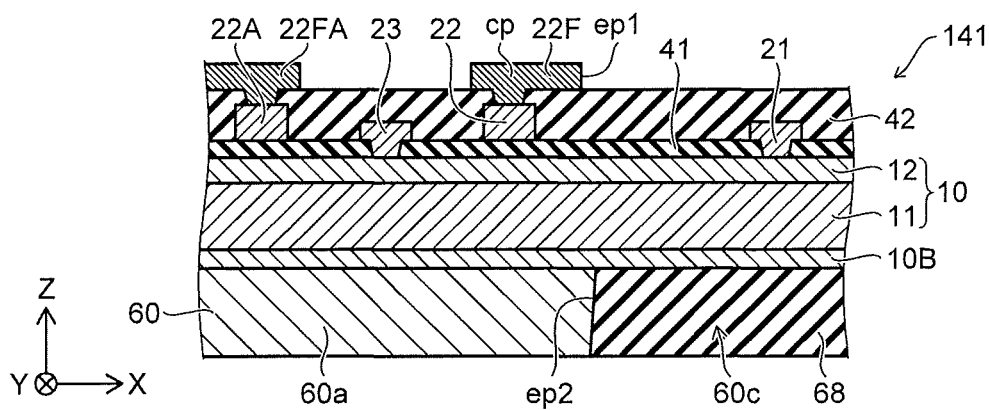
Figure 26A:
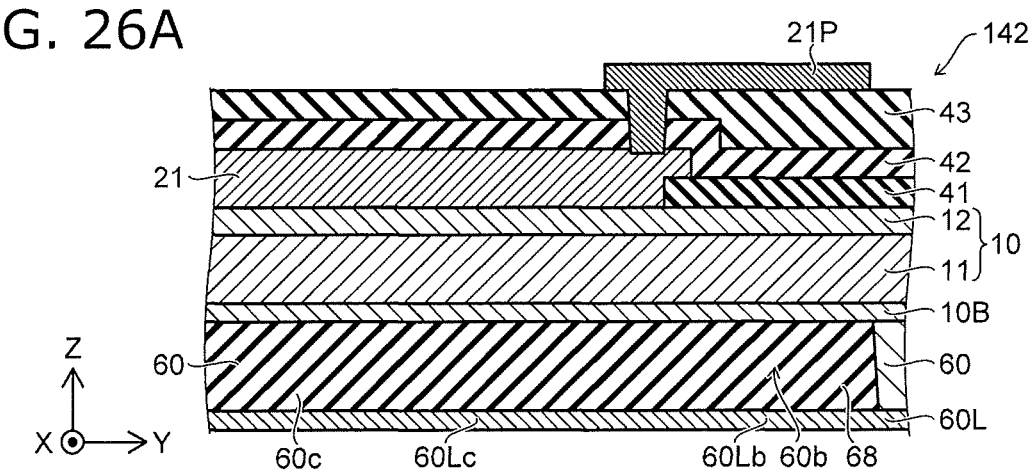
FIG. 26A and FIG. 26B are schematic cross-sectional views illustrating a semiconductor device according to the third embodiment.
Figure 26B:
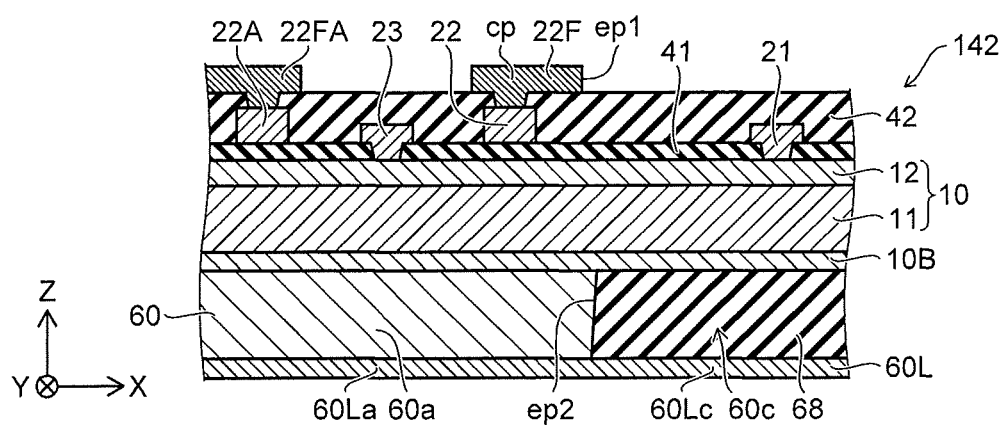
Figure 27A:
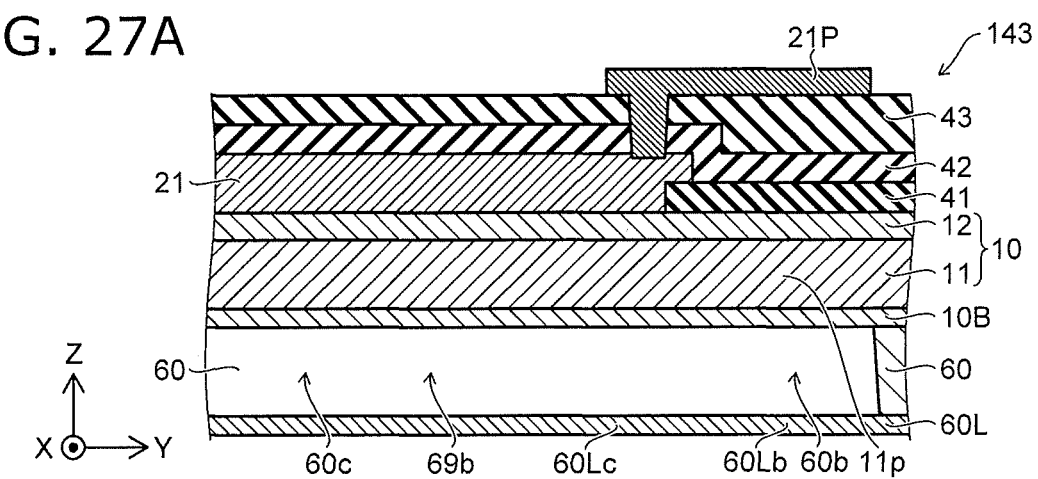
FIG. 27A and FIG. 27B are schematic cross-sectional views illustrating a semiconductor device according to the third embodiment.
Figure 27B:
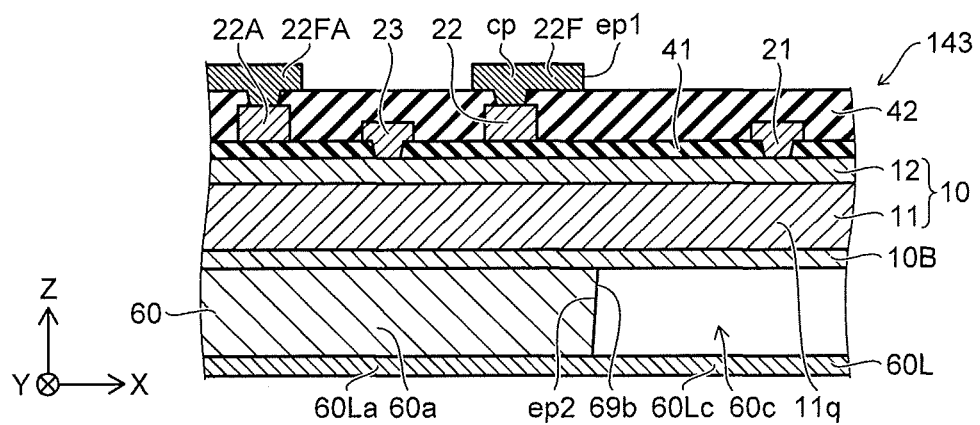
Figure 28A:
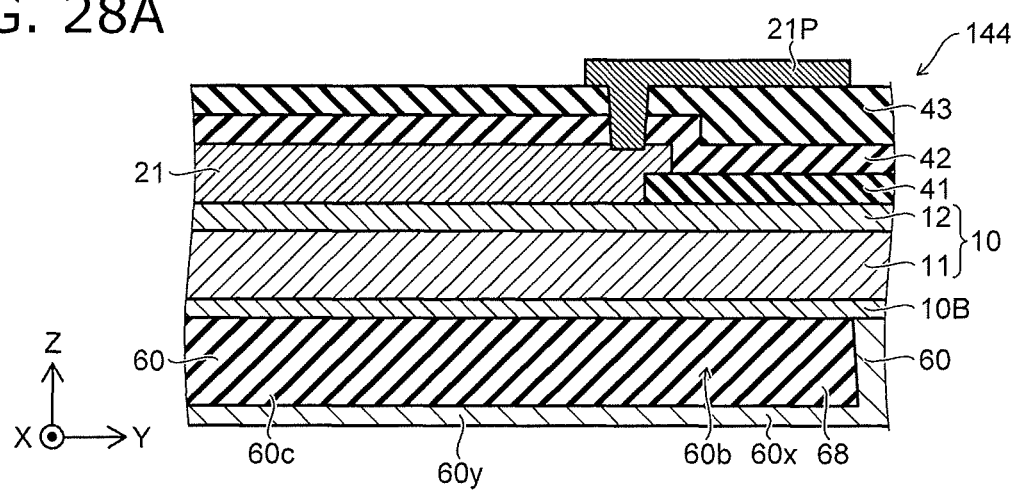
FIG. 28A and FIG. 28B are schematic cross-sectional views illustrating a semiconductor device according to the third embodiment.
Figure 28B:
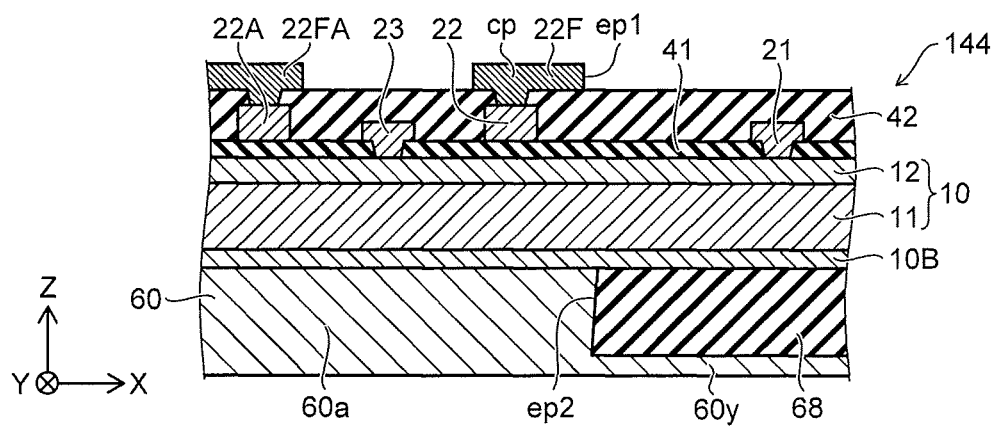
Figure 29A:
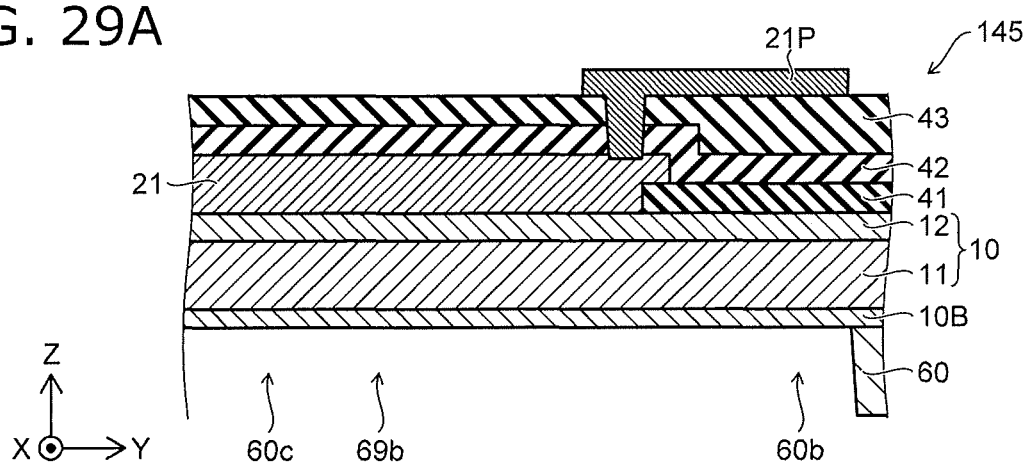
FIG. 29A and FIG. 29B are schematic cross-sectional views illustrating a semiconductor device according to the third embodiment.
Figure 29B:
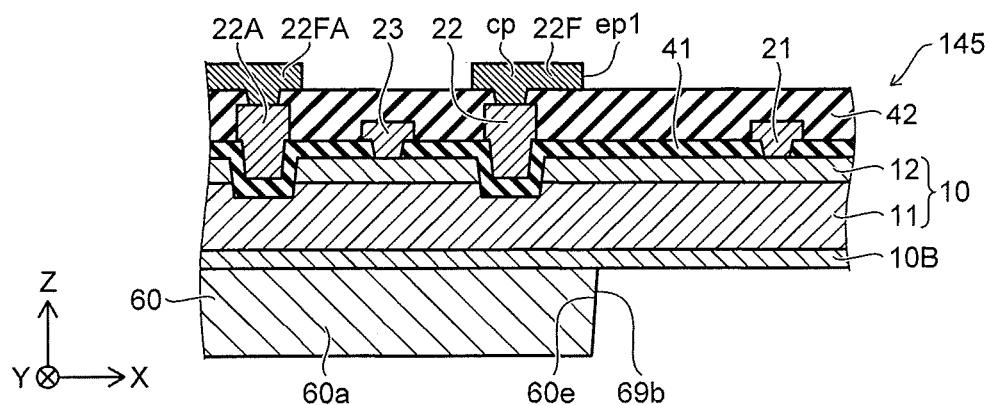
Figure 30A:
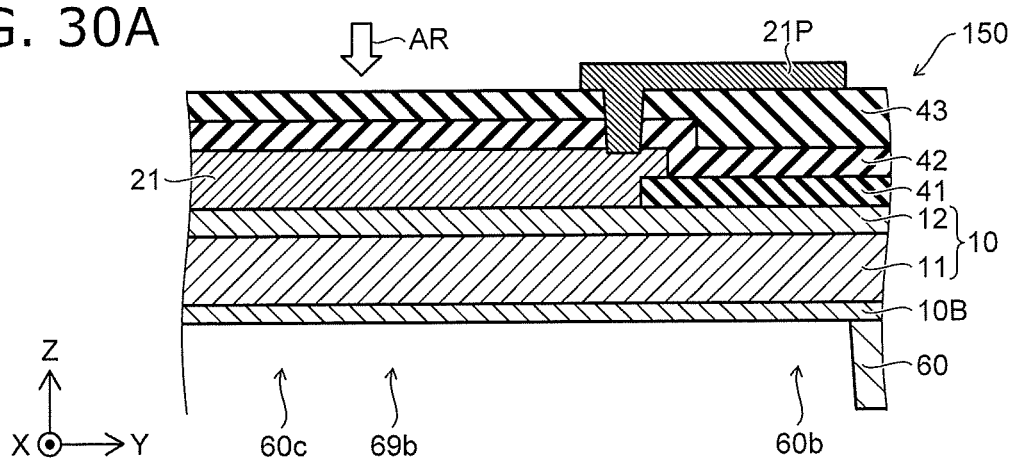
FIG. 30A and FIG. 30B are schematic cross-sectional views illustrating a semiconductor device according to the third embodiment.
Figure 30B:
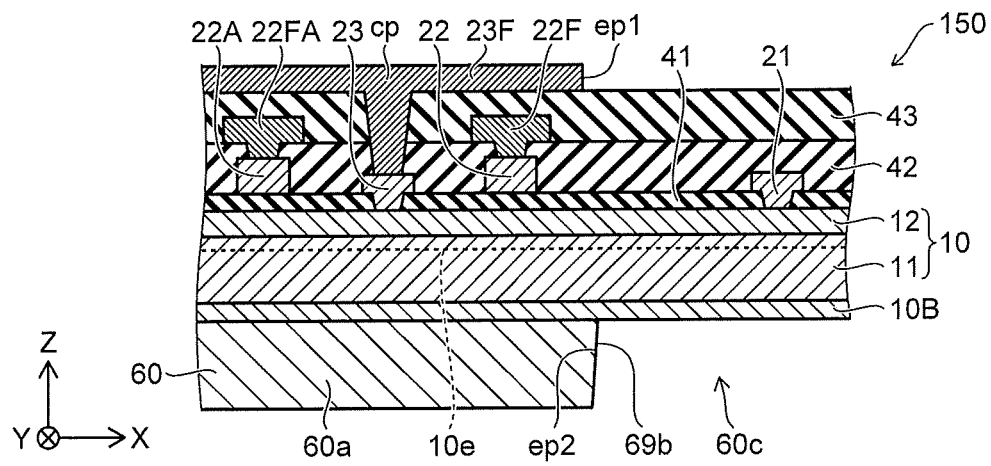
Figure 31A:
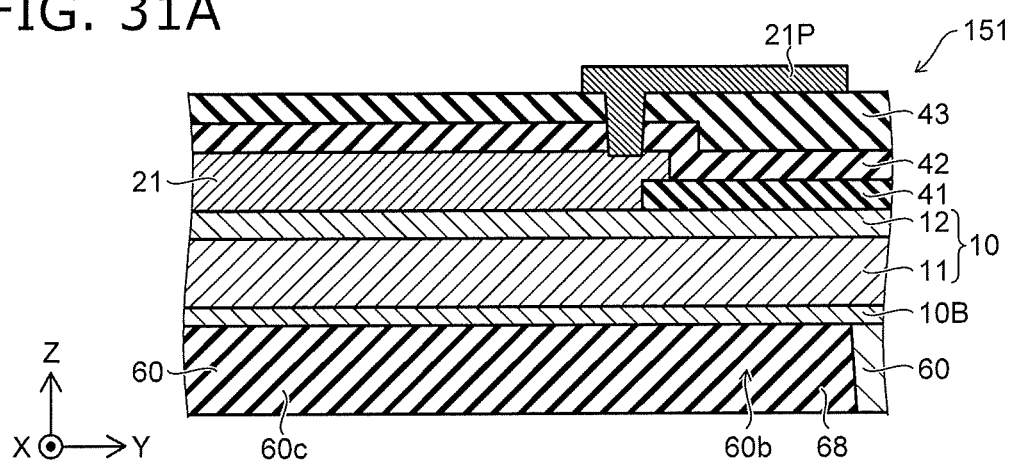
FIG. 31A and FIG. 31B are schematic cross-sectional views illustrating a semiconductor device according to the third embodiment.
Figure 31B:
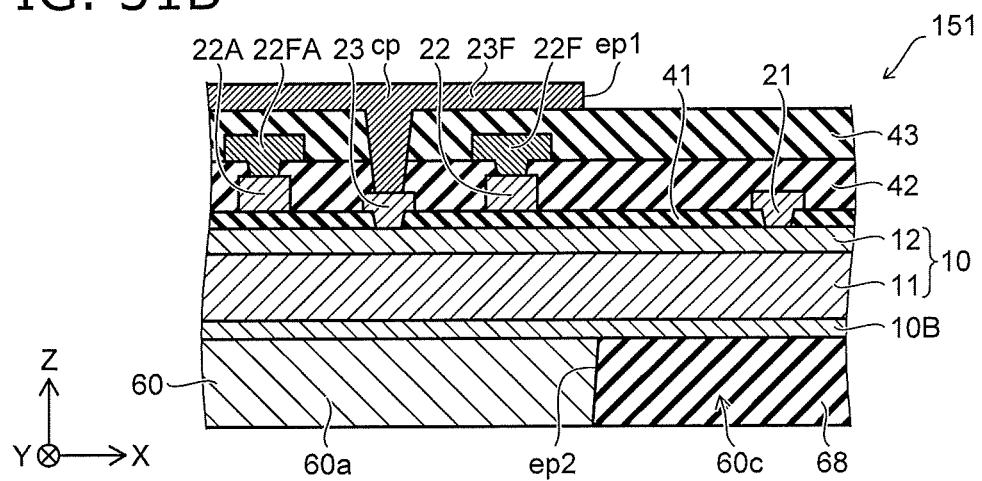
Figure 32A:
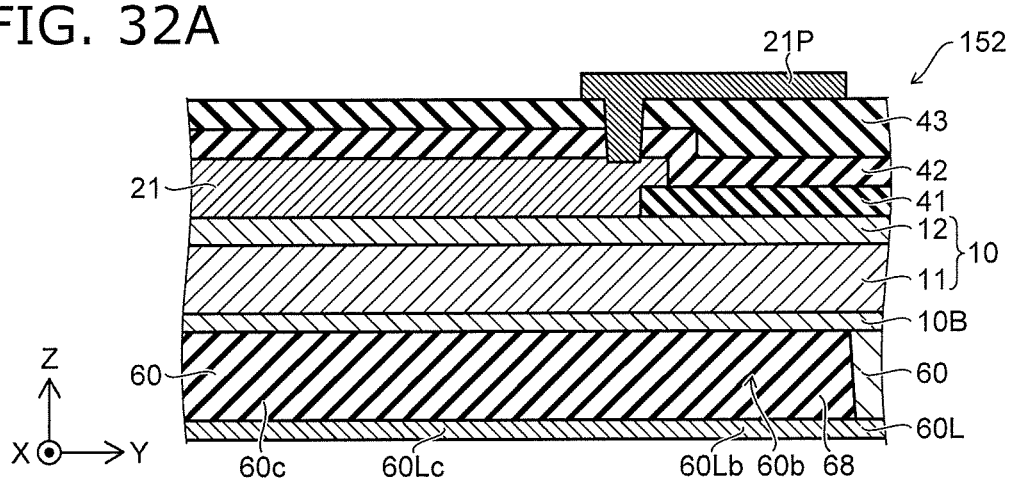
FIG. 32A and FIG. 32B are schematic cross-sectional views illustrating a semiconductor device according to the third embodiment.
Figure 32B:
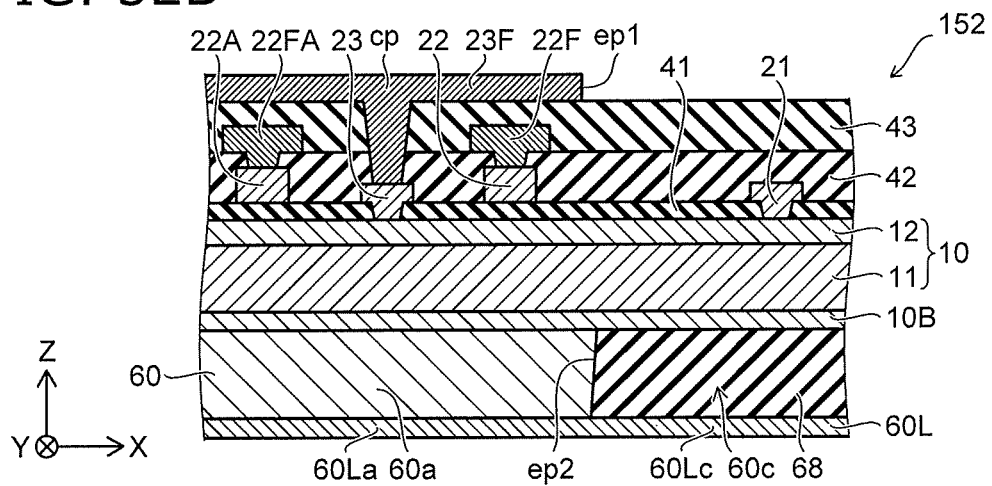
Figure 33A:
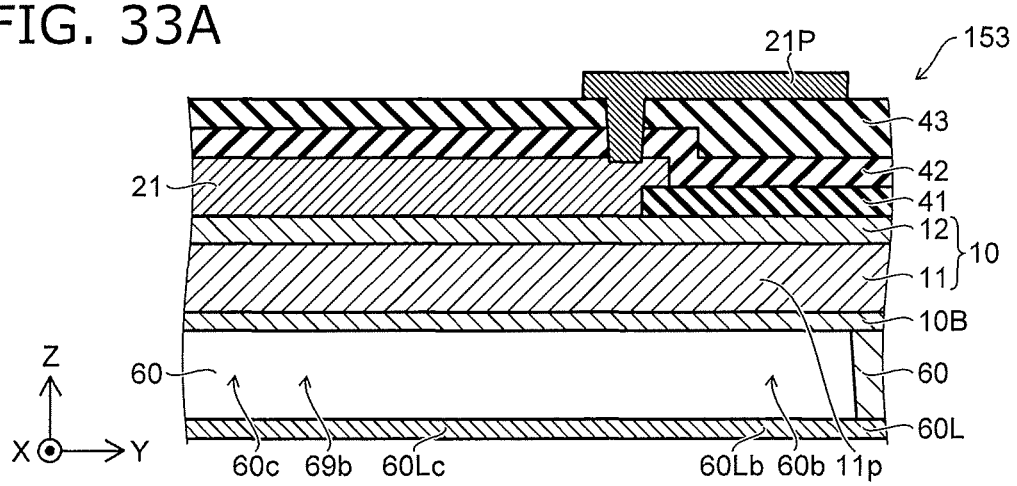
FIG. 33A and FIG. 33B are schematic cross-sectional views illustrating a semiconductor device according to the third embodiment.
Figure 33B:
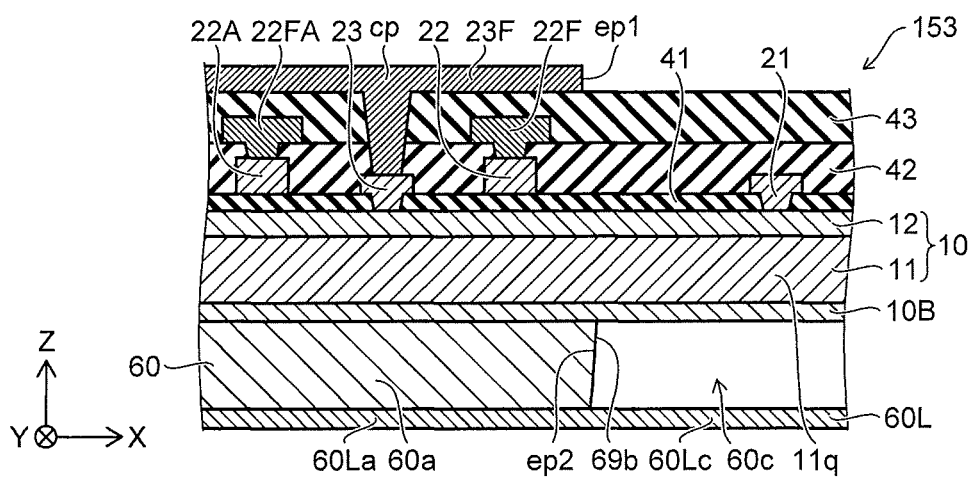
Figure 34A:
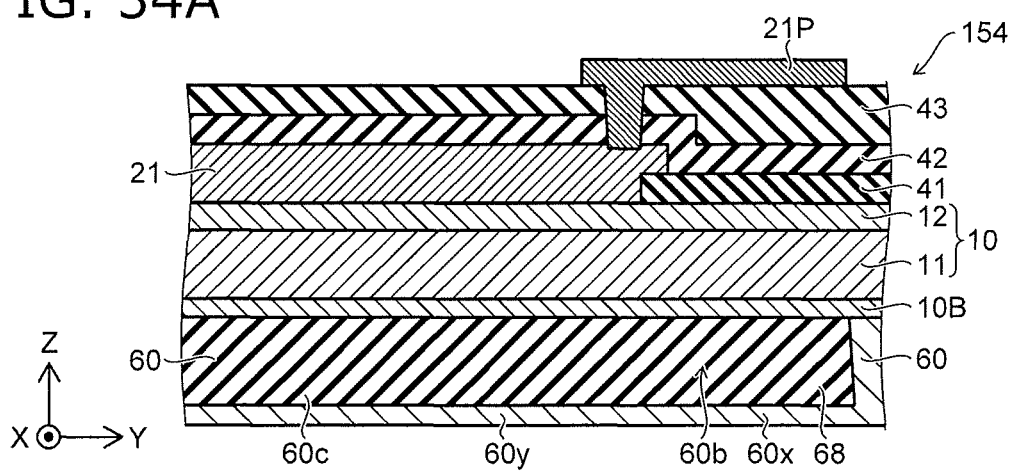
FIG. 34A and FIG. 34B are schematic cross-sectional views illustrating a semiconductor device according to the third embodiment.
Figure 34B:
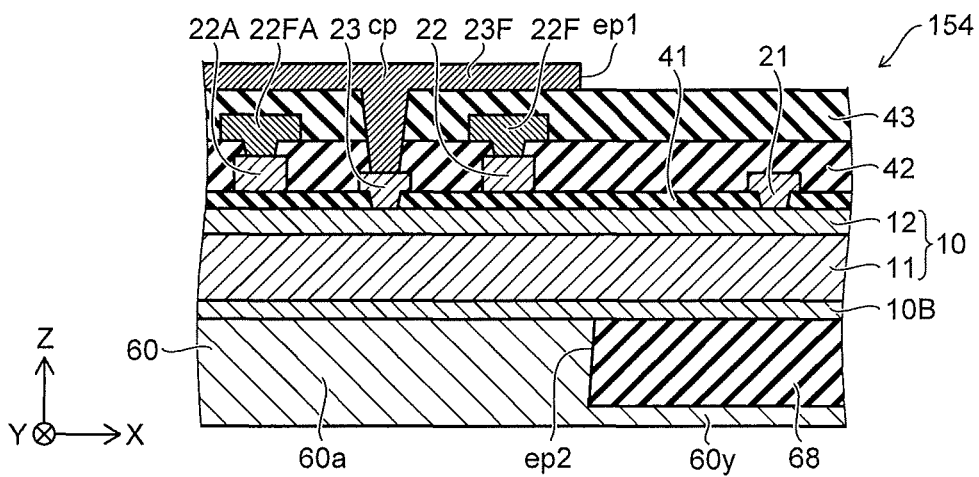
Figure 35A:
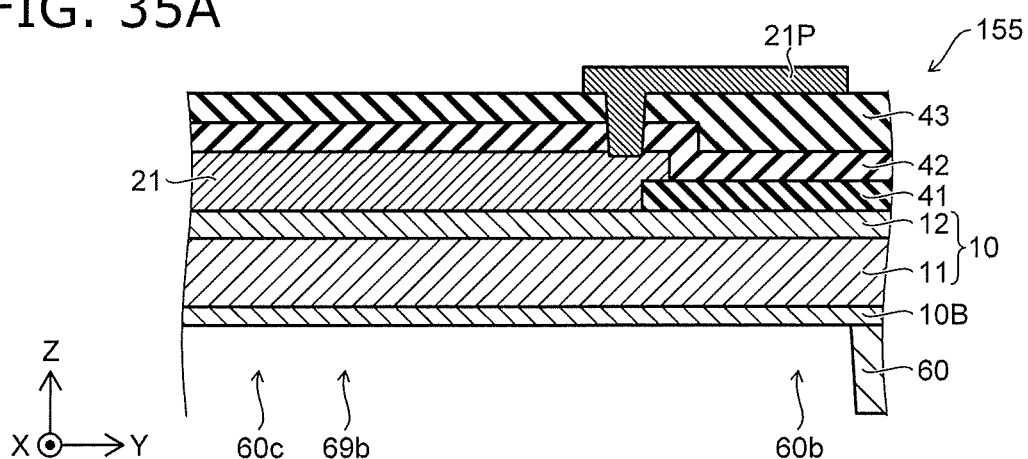
FIG. 35A and FIG. 35B are schematic cross-sectional views illustrating a semiconductor device according to the third embodiment.
Figure 35B:
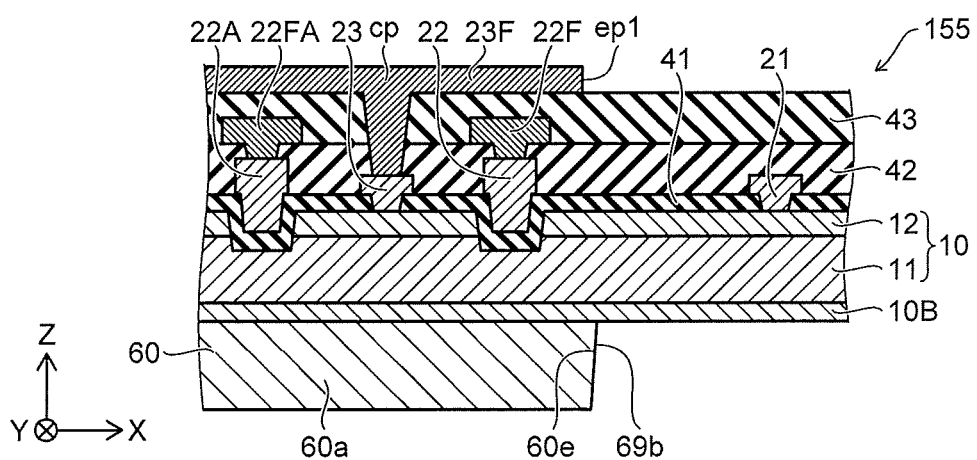

FIG. 24A and FIG. 24B are schematic cross-sectional views illustrating a semiconductor device according to the third embodiment.

FIG. 24A is a cross-sectional view corresponding to a line A1-A2 cross section of FIG. 16A. FIG. 24B is a cross-sectional view corresponding to a line B1-B2 cross section of FIG. 16A.

As shown in FIG. 24A and FIG. 24B, the semiconductor device 140 according to the embodiment includes the first electrode 21, the second electrode 22, the third electrode 23, the first member 60, the first semiconductor region 11, the second semiconductor region 12, the conductive portion 21P, and a conductive member (a second conductive member 22F). Otherwise, the configuration of the semiconductor device 140 may be similar to that of the semiconductor device 130.

As shown in FIG. 24B, the second conductive member 22F is electrically connected to the second electrode 22. The second electrode 22 is between the first semiconductor region 11 and at least a portion of the second conductive member 22F in the third direction (e.g., the Z-axis direction).

The second conductive member 22F includes the connection portion cp and the first end portion ep1. The direction from the second electrode 22 toward the connection portion cp is aligned with the third direction (e.g., the Z-axis direction). The connection portion cp is electrically connected to the second electrode 22. The direction from the connection portion cp toward the first end portion ep1 is aligned with the second direction (e.g., the X-axis direction). For example, the connection portion cp is electrically connected to the second electrode 22 at any position in the Y-axis direction. For example, the connection portion cp is electrically connected to the second electrode 22 at any position in the Y-axis direction. As shown in FIG. 24B, an other second conductive member 22FA that is electrically connected to the other second electrode 22A may be further provided.

The position of the first end portion ep1 in the second direction (e.g., the X-axis direction) is between the position of the connection portion cp in the second direction and the position of the first electrode 21 in the second direction.

The second conductive member 22F is, for example, a field plate on the gate side.

For example, the position of the first end portion ep1 in the second direction (e.g., the X-axis direction) is between the position of the second electrode 22 in the second direction and the position of the first electrode 21 in the second direction.

By providing the second conductive member 22F, the concentration of the electric field in the region proximal to the end of the second electrode 22 is relaxed. As described above, when in use, the first member 60 is set to the potential of the source (the third electrode 23). For example, the concentration of the electric field in the region proximal to the first end portion ep1 is suppressed.

Because the position of the second end portion ep2 is between the position of the first end portion ep1 in the second direction and the position of the first electrode 21 in the second direction, the capacitance between the first electrode 21 and the first member 60 can be reduced while suppressing the concentration of the electric field. The loss can be suppressed while suppressing the concentration of the electric field.

Also, in the operating state, a depleted region is formed by the drain voltage (e.g., 400 V, etc.) inside the semiconductor member 10. The depleted region is between the second electrode 22 and the first electrode 21 in the X-axis direction. There is an undepleted region between the depleted region and the first electrode 21. In the switching operation, the undepleted region substantially does not contribute to the electric field relaxation. The undepleted region causes a loss.

For example, the distance (the first distance) in the second direction between the position in the second direction (e.g., the X-axis direction) of the first end portion ep1 and the position in the second direction of the second end portion ep2 may be not more than ⅘ of the distance (the second distance) in the second direction between the position in the second direction of the first end portion ep1 and the position in the second direction of the first electrode 21. The first distance may be not less than 1/10 of the second distance. The capacitance can be reduced more effectively while suppressing the concentration of the electric field.

In the semiconductor device 140, in the case where the third region 60c has the hole 69, the second end portion ep2 corresponds to the side portion of the hole 69 of which the position in the X-axis direction is most proximal to the second electrode 22. As described below, in the case where the third region 60c includes the insulating member 68, the second end portion ep2 corresponds to the side portion of the insulating member 68 of which the position in the X-axis direction is most proximal to the second electrode 22.

As recited above, the conductive member (the first conductive member 23F or the second conductive member 22F) is electrically connected to one of the second electrode 22 or the third electrode. The conductive member includes the connection portion cp and the first end portion ep1. The direction from the one of the second electrode 22 or the third electrode 23 recited above toward the connection portion cp is aligned with the third direction (e.g., the Z-axis direction). The connection portion cp is electrically connected to the one of the second electrode 22 or the third electrode 23 recited above.

FIG. 25A, FIG. 25B, FIG. 26A, FIG. 26B, FIG. 27A, FIG. 27B, FIG. 28A, FIG. 28B, FIG. 29A, and FIG. 29B are schematic cross-sectional views illustrating semiconductor devices according to the third embodiment.

As in semiconductor devices 141 to 145 shown in these drawings, the second conductive member 22F may be provided instead of the first conductive member 23F in the semiconductor devices 131 to 135.

FIG. 30A, FIG. 30B, FIG. 31A, FIG. 31B, FIG. 32A, FIG. 32B, FIG. 33A, FIG. 33B, FIG. 34A, FIG. 34B, FIG. 35A, and FIG. 35B are schematic cross-sectional views illustrating semiconductor devices according to the third embodiment.

As in semiconductor devices 150 to 155 shown in these drawings, the first conductive member 23F and the second conductive member 22F may be provided.

In the semiconductor devices 140 to 145 and 150 to 155 as well, the loss can be reduced.

In the above embodiments, a direction from a part of the second electrode 22 toward the second semiconductor region 12 may be along the second direction (the X-axis direction, for example).

According to the embodiments, a semiconductor device can be provided in which the loss can be reduced.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, conductive portions, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

What is claimed is:

1. A semiconductor device, comprising:
a first electrode extending along a first direction;
a second electrode including a portion extending along the first direction;
a third electrode extending along the first direction, a position of the second electrode in a second direction being between a position of the third electrode in the second direction and a position of the first electrode in the second direction, the second direction crossing the first direction, a distance along the second direction between the third electrode and the second electrode being shorter than a distance along the second direction between the second electrode and the first electrode;
a first member including a first region and a second region, a conductivity of the second region being lower than a conductivity of the first region, a direction from the first member toward the first electrode, a direction from the first region toward the second electrode, and a direction from the first region toward the third electrode being aligned with a third direction crossing a plane including the first direction and the second direction;
a first semiconductor region including $Al_{x1}Ga_{1-x1}N$ ($0 \leq x1 < 1$) and being provided, in the third direction, between the first member and the first electrode, between the first member and the second electrode, and between the first member and the third electrode;
a second semiconductor region including $Al_{x2}Ga_{1-x2}N$ ($0 < x2 \leq 1$ and $x1 < x2$), the first semiconductor region being between the first member and the second semiconductor region in the third direction; and
a conductive portion electrically connected to the first electrode, a direction from the second region toward the conductive portion being aligned with the third direction, a length along the second direction of the conductive portion being longer than a length along the second direction of the first electrode.

2. The device according to claim 1, wherein a portion of the first semiconductor region is provided between the second region and the conductive portion in the third direction.

3. The device according to claim 1, further comprising an insulating film provided between the second electrode and the first semiconductor region.

4. The device according to claim 1, wherein
the first region includes silicon, and
the second region includes an insulating member.

5. The device according to claim 1, wherein the second region has a plurality of holes.

6. The device according to claim 1, further comprising a first layer including a first partial region and a second partial region,
the first region being provided between the first partial region and the first semiconductor region in the third direction,
the second region being provided between the second partial region and the first semiconductor region in the third direction.

7. The device according to claim 1, wherein a direction from a part of the second electrode toward the second semiconductor region is along the second direction.

8. The device according to claim 1, wherein
the first member further includes a third region,
a conductivity of the third region is lower than the conductivity of the first region, and
a direction from the third region toward the first electrode is aligned with the third direction.

9. The device according to claim 8, further comprising a conductive member electrically connected to one of the second electrode or the third electrode,
the second electrode being between the first semiconductor region and at least a portion of the conductive member in the third direction,
the conductive member including a connection portion and a first end portion,
a direction from the one of the second electrode or the third electrode toward the connection portion being aligned with the third direction,
the connection portion being electrically connected to the one of the second electrode or the third electrode,
a direction from the connection portion toward the first end portion being aligned with the second direction,
a position of the first end portion in the second direction being between a position of the connection portion in the second direction and the position of the first electrode in the second direction,
the first region including a second end portion opposing the third region,
a position of the second end portion in the second direction being between the position of the first end portion in the second direction and the position of the first electrode in the second direction.

10. The device according to claim 9, wherein the position of the first end portion in the second direction is between the position of the second electrode in the second direction and the position of the first electrode in the second direction.

11. The device according to claim 8, wherein the third region has a hole.

12. A semiconductor device, comprising:
a first electrode extending along a first direction;
a second electrode including a portion extending along the first direction;
a third electrode extending along the first direction, a position of the second electrode in a second direction being between a position of the third electrode in the second direction and a position of the first electrode in the second direction, the second direction crossing the first direction, a distance along the second direction between the third electrode and the second electrode being shorter than a distance along the second direction between the second electrode and the first electrode;
a first layer including a first partial region and a second partial region, a direction from the first layer toward the first electrode, a direction from the first partial region toward the second electrode, and a direction from the first partial region toward the third electrode being aligned with a third direction crossing a plane including the first direction and the second direction;
a first member including a first region, the first region being conductive and being provided, in the third direction, between the first partial region and the second electrode and between the first partial region and the third electrode;
a first semiconductor region including $Al_{x1}Ga_{1-x1}N$ ($0 \le x1 < 1$) and being provided, in the third direction, between the first member and the first electrode, between the first member and the second electrode, and between the first member and the third electrode;
a second semiconductor region including $Al_{x2}Ga_{1-x2}N$ ($0 < x2 \le 1$ and $x1 < x2$), the first semiconductor region being between the first member and the second semiconductor region in the third direction; and
a conductive portion electrically connected to the first electrode, a direction from the second partial region toward the conductive portion being aligned with the third direction, a length along the second direction of the conductive portion being longer than a length along the second direction of the first electrode,
the first semiconductor region including a first portion overlapping the conductive portion in the third direction,
the first member having a first hole provided between the second partial region and the first portion in the third direction.

13. The device according to claim 12, wherein
the first layer further includes a third partial region,
the first semiconductor region further includes a second portion overlapping the first electrode in the third direction, and
the first member further has a second hole provided between the third partial region and the second portion in the third direction.

14. The device according to claim 12, further comprising a conductive member electrically connected to one of the second electrode or the third electrode,
the second electrode being between the first semiconductor region and at least a portion of the conductive member in the third direction,
the conductive member including a connection portion and a first end portion,
a direction from the one of the second electrode or the third electrode toward the connection portion being aligned with the third direction,
the connection portion being electrically connected to the one of the second electrode or the third electrode,
a direction from the connection portion toward the first end portion being aligned with the second direction,
a position of the first end portion in the second direction being between a position of the connection portion in the second direction and the position of the first electrode in the second direction,
the first partial region including a second end portion opposing the second hole,
a position of the second end portion in the second direction being between the position of the first end portion in the second direction and the position of the first electrode in the second direction.

15. The device according to claim 14, wherein the position of the first end portion in the second direction is between the position of the first electrode in the second direction and the position of the second electrode in the second direction.

16. The device according to claim 12, wherein a direction from a part of the second electrode toward the second semiconductor region is along the second direction.

17. A semiconductor device, comprising:
a first electrode extending along a first direction;
a second electrode including a portion extending along the first direction;
a third electrode extending along the first direction, a position of the second electrode in a second direction being between a position of the third electrode in the second direction and a position of the first electrode in the second direction, the second direction crossing the first direction, a distance along the second direction between the third electrode and the second electrode being shorter than a distance along the second direction between the second electrode and the first electrode;
a first member including a first region and a third region, a conductivity of the third region being lower than a conductivity of the first region, a direction from the third region toward the first electrode, a direction from the first region toward the second electrode, and a direction from the first region toward the third electrode being aligned with a third direction crossing a plane including the first direction and the second direction;
a first semiconductor region including $Al_{x1}Ga_{1-x1}N$ ($0 \le x1 < 1$) and being provided, in the third direction, between the first member and the first electrode, between the first member and the second electrode, and between the first member and the third electrode;
a second semiconductor region including $Al_{x2}Ga_{1-x2}N$ ($0 < x2 \le 1$ and $x1 < x2$), the first semiconductor region in the third direction being between the first member and the second semiconductor region; and
a conductive member electrically connected to one of the second electrode or the third electrode,
the second electrode being between the first semiconductor region and at least a portion of the conductive member in the third direction,
the conductive member including a connection portion and a first end portion,
a direction from the one of the second electrode or the third electrode toward the connection portion being aligned with the third direction, the connection portion being electrically connected to the one of the second electrode or the third electrode, a direction from the connection portion toward the first end portion being aligned with the second direction, a position of the first end portion in the second direction being between a position of the connection portion in the second direction and the position of the first electrode in the second direction, the first region including a second end portion opposing the third region, a position of the second end portion in the second direction being between the position of the first end portion in the second direction and the position of the first electrode in the second direction.

18. The device according to claim 17, further comprising an insulating film provided between the second electrode and the second semiconductor region.

19. The device according to claim 17, further comprising a first layer including a first partial region and a second partial region, the first region being provided between the first partial region and the first semiconductor region in the third direction, the third region being provided between the second partial region and the first semiconductor region in the third direction.

20. The device according to claim 17, wherein a direction from a part of the second electrode toward the second semiconductor region is along the second direction.

* * * * *